(12) United States Patent
Ananiev et al.

(10) Patent No.: US 10,867,893 B2
(45) Date of Patent: Dec. 15, 2020

(54) SEMICONDUCTOR DEVICES AND METHODS FOR FORMING A SEMICONDUCTOR DEVICE

(71) Applicant: Infineon Technologies AG, Neubiberg (DE)

(72) Inventors: Sergey Ananiev, Ottobrunn (DE); Robert Bauer, Moosach (DE); Heinrich Koerner, Bruckmuehl (DE); Yik Yee Tan, Melaka (MY); Juergen Walter, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/685,880

(22) Filed: Aug. 24, 2017

(65) Prior Publication Data

US 2018/0061742 A1 Mar. 1, 2018

(30) Foreign Application Priority Data

Aug. 25, 2016 (DE) .......................... 10 2016 115 848

(51) Int. Cl.
*H01L 23/488* (2006.01)
*H01L 23/00* (2006.01)

(52) U.S. Cl.
CPC .......... *H01L 23/488* (2013.01); *H01L 23/564* (2013.01); *H01L 24/05* (2013.01); *H01L 24/09* (2013.01); *H01L 24/03* (2013.01); *H01L 24/85* (2013.01); *H01L 2224/0401* (2013.01); *H01L 2224/04042* (2013.01); *H01L 2224/05166* (2013.01); *H01L 2224/05557* (2013.01); *H01L 2224/05624* (2013.01); *H01L 2224/05644* (2013.01); *H01L 2224/05647* (2013.01); *H01L 2224/13101* (2013.01); *H01L 2224/45124* (2013.01); *H01L 2224/45144* (2013.01); *H01L 2224/45147* (2013.01); *H01L 2224/484* (2013.01); *H01L 2224/48507* (2013.01);
(Continued)

(58) Field of Classification Search
None
See application file for complete search history.

(56) References Cited

U.S. PATENT DOCUMENTS 5,053,850 A 10/1991 Baker et al.
8,742,598 B2 6/2014 Meinhold
(Continued)

FOREIGN PATENT DOCUMENTS

JP H02235350 A 9/1990
JP H0383352 A 4/1991
(Continued)

*Primary Examiner* — Mounir S Amer
(74) *Attorney, Agent, or Firm* — Slater Matsil, LLP

(57) ABSTRACT

A semiconductor device includes an electrically conductive contact pad structure. Moreover, the semiconductor device includes a bond structure. The bond structure is in contact with the electrically conductive contact pad structure at least at an enclosed interface region. Additionally, the semiconductor device includes a degradation prevention structure laterally surrounding the enclosed interface region. The degradation prevention structure is vertically located between a portion of the bond structure and a portion of the electrically conductive contact pad structure.

26 Claims, 8 Drawing Sheets

(52) U.S. Cl.
CPC ............... *H01L 2224/48824* (2013.01); *H01L 2224/85365* (2013.01)

(56) References Cited

U.S. PATENT DOCUMENTS

| | | | | |
|---|---|---|---|---|
| 8,828,860 | B2* | 9/2014 | Gruber | B23K 3/0638 |
| | | | | 438/612 |
| 9,871,013 | B2* | 1/2018 | Tsai | H01L 23/147 |
| 2002/0079584 | A1 | 6/2002 | Matsunaga | |
| 2008/0303152 | A1* | 12/2008 | Zhang | H01L 24/10 |
| | | | | 257/738 |
| 2010/0024213 | A1 | 2/2010 | Herbert et al. | |
| 2013/0075900 | A1* | 3/2013 | Shim | H01L 21/4846 |
| | | | | 257/737 |
| 2014/0167253 | A1* | 6/2014 | Tseng | H01L 23/5283 |
| | | | | 257/737 |
| 2015/0194397 | A1* | 7/2015 | Jeng | H01L 24/05 |
| | | | | 438/652 |
| 2015/0214165 | A1* | 7/2015 | Tsai | H01L 23/5226 |
| | | | | 257/758 |
| 2016/0064315 | A1* | 3/2016 | Wu | H01L 21/4853 |
| | | | | 361/783 |
| 2016/0190090 | A1* | 6/2016 | Yu | H01L 24/16 |
| | | | | 438/108 |
| 2017/0033075 | A1* | 2/2017 | Shu | H01L 23/3142 |

FOREIGN PATENT DOCUMENTS

| | | | |
|---|---|---|---|
| JP | 2003142521 A | 5/2003 | |
| JP | 2014056917 A | 3/2014 | |

\* cited by examiner

US 10,867,893 B2

SEMICONDUCTOR DEVICES AND METHODS FOR FORMING A SEMICONDUCTOR DEVICE

CROSS-REFERENCE TO RELATED APPLICATIONS

This application claims priority to German patent application No. 102016115848.8, filed on Aug. 25, 2016, which application is hereby incorporated herein by reference in its entirety.

TECHNICAL FIELD

Embodiments relate to concepts for connecting contact pads of semiconductor devices and in particular to semiconductor devices and methods for forming semiconductor devices.

BACKGROUND

Semiconductor devices often comprise contact pads used for electrically connecting the semiconductor device to external electrical structures. For example, contact pads may be located on a semiconductor die of the semiconductor device. Bond wires can be employed for connecting the semiconductor die with a lead frame, and/or for connecting the semiconductor die directly with external electrical structures. Semiconductor devices may suffer from degradation processes such as corrosion and/or other chemical reactions occurring at the contact pads, for example.

SUMMARY

There may be a demand to provide an improved concept for semiconductor devices, which may enable a higher reliability of semiconductor devices and/or a higher yield during manufacturing and/or a longer lifetime of semiconductor devices.

Such a demand may be satisfied by the subject matter of the claims.

Some embodiments relate to a semiconductor device comprising an electrically conductive contact pad structure. Moreover, the semiconductor device comprises a bond structure. The bond structure is in contact with the electrically conductive contact pad structure at least at an enclosed interface region. Additionally, the semiconductor device comprises a degradation prevention structure laterally surrounding the enclosed interface region. The degradation prevention structure is vertically located between a portion of the bond structure and a portion of the electrically conductive contact pad structure.

Some embodiments relate to another semiconductor device comprising an electrically conductive contact pad structure. The electrically conductive contact pad structure comprises a first predominant electrically conductive material. Moreover, the semiconductor device comprises a bond structure. The bond structure comprises a second predominant electrically conductive material different from the first predominant electrically conductive material. At least one of the electrically conductive contact pad structure and the bond structure comprises an intermetallic phase region at an interface region between the electrically conductive contact pad structure and the bond structure. Additionally, the semiconductor device comprises a degradation prevention structure located laterally adjacent to the intermetallic phase region. Furthermore, the degradation prevention structure is vertically located between a portion of the bond structure and a portion of the electrically conductive contact pad structure.

Some embodiments relate to a method for forming a semiconductor device. The method comprises forming a degradation prevention structure at an electrically conductive contact pad structure of the semiconductor device. The degradation prevention structure laterally surrounds a portion of a surface of the electrically conductive contact pad structure. Furthermore, the method comprises attaching a bond structure at least at the portion of the surface of the electrically conductive contact pad structure laterally surrounded by the degradation prevention structure. After attaching, the degradation prevention structure is vertically located between a portion of the bond structure and a portion of the electrically conductive contact pad structure.

Some embodiments relate to another method for forming a semiconductor device. The method comprises forming a degradation prevention structure at an electrically conductive contact pad structure of the semiconductor device. The electrically conductive contact pad structure comprises a first predominant electrically conductive material. Furthermore, the method comprises attaching a bond structure comprising a second predominant electrically conductive material different from the first predominant electrically conductive material at the electrically conductive contact pad structure. Attaching the bond structure comprises forming an intermetallic phase region at an interface region between the electrically conductive contact pad structure and the bond structure. The intermetallic phase region is located laterally adjacent to the degradation prevention structure. After attaching, the degradation prevention structure is vertically located between a portion of the bond structure and a portion of the electrically conductive contact pad structure.

BRIEF DESCRIPTION OF THE DRAWINGS

Some embodiments of apparatuses and/or methods will be described in the following by way of example only, and with reference to the accompanying figures, in which

FIG. 2b shows a schematic top view of the portion of the semiconductor device of FIG. 2a;

DETAILED DESCRIPTION OF ILLUSTRATIVE EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
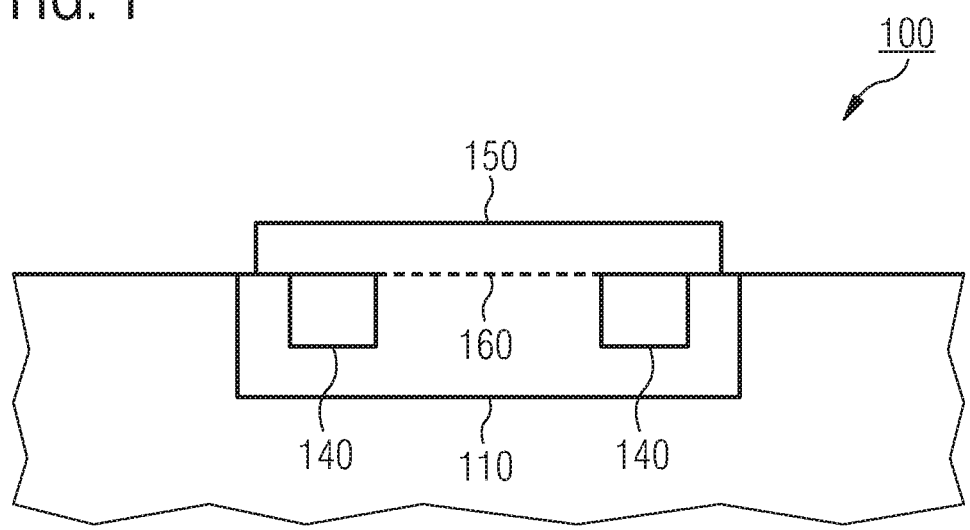
FIG. 1 shows a schematic cross section of a portion of a semiconductor device through an electrically conductive contact pad structure, a bond structure, and a degradation prevention structure.

FIG. 1 shows a schematic cross section of a portion of a semiconductor device 100 according to an embodiment. The semiconductor device 100 comprises an electrically conductive contact pad structure no. Moreover, the semiconductor device 100 comprises a bond structure 150. The bond structure 150 is in contact with the electrically conductive contact pad structure 110 at least at an enclosed interface region 160. Additionally, the semiconductor device 100 comprises a degradation prevention structure 140 laterally surrounding the enclosed interface region 160. The degradation prevention structure 140 is vertically located between a portion of the bond structure 150 and a portion of the electrically conductive contact pad structure no.

Degradation of an electrical contact between an electrically conductive contact pad structure and a bond structure of a semiconductor device may be reduced and/or prevented by implementing a degradation prevention structure at an interface region between the electrically conductive contact pad structure and the bond structure. An enclosed interface region laterally surrounded by the degradation prevention structure may circumferentially be protected from degradation processes initiated at a portion of the electrically conductive contact pad structure and/or at a portion of the bond structure outside the enclosed interface region. A degradation process (e.g., a corrosion process or other chemical processes) may be prevented from propagating to the enclosed interface region due to the degradation prevention structure and may stop at the degradation prevention structure. The degradation prevention structure may thus increase the reliability of the semiconductor device and/or increase the yield during manufacturing and/or increase the lifetime of semiconductor device.

For example, the degradation prevention structure 140 may comprise a trench extending into the electrically conductive contact pad structure. The trench may be filled with a solid dielectric material or a cavity may alternatively be located in the trench, for example. Alternatively (or additionally), the degradation prevention structure 140 may comprise a solid dielectric material structure located on a surface (e.g., the front side surface) of the electrically conductive contact pad structure 100. Alternatively, the degradation prevention structure 140 may comprise an electrically conductive layer located on the front side surface of the electrically conductive contact pad structure 100.

The electrically conductive contact pad structure 110 may provide a contact to electrical element structures (e.g., transistors, diodes, capacitors, or other passive electrical structures) of the semiconductor device 100. For example, the electrically conductive contact pad structure 110 (or a plurality of electrically conductive contact pad structures) may be located on a final (e.g., top) metallization layer of a wiring layer stack of the semiconductor device 100. The wiring layer stack may be located on a semiconductor substrate (e.g., above a front side surface of the semiconductor substrate) of the semiconductor device 100 and may comprise electrical connections to and between electrical element structures of the semiconductor device 100 located at the semiconductor substrate and/or within the wiring layer stack. The final metallization layer of the wiring layer stack may be located at a front side surface of the wiring layer stack and may comprise an interface with air and/or with a semiconductor package structure as well as one or more bond structures 150.

The electrically conductive contact pad structure 110 may comprise a first predominant electrically conductive material. The first predominant electrically conductive material may be a metal, a metal-alloy, or a metal-semiconductor-alloy, for example. For example, the first predominant electrically conductive material may be aluminum, copper or gold or an alloy comprising predominantly aluminum, copper or gold. The electrically conductive contact pad structure 110 may comprise a single electrical conductive layer (e.g. aluminum or copper) or a stack of electrically conductive layers comprising one or more barrier layers (e.g. titanium or titanium nitride) and one or more metal layers (e.g. aluminum or copper).

The bond structure 150 may be a bond wire, a solder ball or a solder pillar, for example. The bond structure 150 may comprise a second predominant electrically conductive material. The second predominant electrically conductive material may be a metal, metal-alloy, or a metal-semiconductor-alloy, for example. For example, the second predominant electrically conductive material may be aluminum, copper, gold or an alloy comprising predominantly aluminum, copper or gold.

The first predominant electrically conductive material may be the same (or substantially the same) as the second predominant electrically conductive material. In this case, the enclosed interface region 160 may be a two-dimensional area of direct contact between the electrically conductive contact pad structure 110 and the bond structure 150. For example, the electrically conductive contact pad structure 110 and the bond structure 150 are in touch with each other at least at the enclosed interface region 160. This two-dimensional area of direct contact is laterally completely surrounded (e.g., enclosed) by the degradation prevention structure 140, for example.

Alternatively, the electrically conductive contact pad structure 110 may comprise a first predominant electrically conductive material (e.g. aluminum) different from the second predominant electrically conductive material (e.g. copper) comprised by the bond structure 150. The electrically conductive contact pad structure 110 and/or the bond structure 150 may then comprise an intermetallic phase region at the enclosed interface region 160.

In the case of different first and second predominant electrically conductive materials, the enclosed interface region 160 may be the intermetallic phase region or may be the interface area between the intermetallic phase region and the bond structure 150, if the intermetallic phase region is part of the electrically conductive contact pad structure 110, or may be the interface area between the intermetallic phase region and the electrically conductive contact pad structure 110, if the intermetallic phase region is part of the bond structure 150, for example. The intermetallic phase region may comprise an intermetallic phase material that is based on at least the first predominant electrically conductive material and the second predominant electrically conductive material. For example, atoms of the second predominant electrically conductive material may diffuse to the first predominant electrically conductive material and/or vice versa, such that the electrically conductive contact pad structure 110 and/or the bond structure 150 may comprise an intermetallic phase region. For example, if the first predominant electrically conductive material is aluminum (Al) and the second predominant electrically conductive material is copper (Cu), the intermetallic phase material may be an alloy of copper and aluminum (e.g. $Cu_9Al_4$).

For example, the first and the second predominant electrically conductive materials may comprise a low electrical resistivity and may be selected in such a manner that they comprise a high adhesion to each other during and after attaching the bond structure 150 to the electrically conductive contact pad structure 110.

The intermetallic phase region may establish the connection between the electrically conductive contact pad structure 110 and the bond structure 150. For example, the intermetallic phase region may be located at the enclosed interface region 160 and extend over the entire enclosed interface region 160. Optionally, if several enclosed interface regions (e.g., a plurality of interface regions) are located between the electrically conductive contact pad structure 110 and the bond structure 150, an intermetallic phase region may be located at each enclosed interface region.

Additionally, the bond structure 150 may be in contact (in touch) with the electrically conductive contact pad structure at a peripheral interface region. The peripheral interface region may be located outside the enclosed interface region 160 and outside the degradation prevention structure 140. For example, the enclosed interface region 160 may be located on one side of the degradation prevention structure 140 and the peripheral interface region may be located at another side (e.g., an opposite side) of the degradation prevention structure 140.

Additionally, a peripheral intermetallic phase region may be located at the peripheral interface region. The peripheral interface region and/or the peripheral intermetallic phase region may increase the adhesion between the bond structure 150 and the electrically conductive contact pad structure 110 and/or reduce a contact resistance between the bond structure 150 and the electrically conductive contact pad structure 110.

Optionally, the peripheral interface region may laterally surround the degradation prevention structure 140. In this way, the bond structure 150 may laterally extend over the entire enclosed interface region 160 and over the entire degradation prevention structure 140 to the peripheral interface region, so that the enclosed interface region 160 may be encapsulated by a portion of the bond structure 150 from above, by a portion of the electrically conductive contact pad structure 110 from below, and laterally by the degradation prevention structure 140 and thus be protected all around from degradation processes and/or aggressive elements. This may provide a more reliable electrical contact between the bond structure 150 and the electrically conductive contact pad structure 110.

For example, a maximal lateral extension of the enclosed interface region 160 may be smaller than 90% (or smaller than 80%, or smaller than 70%) of a maximal lateral extension of an overall interface region between the electrically conductive contact pad structure 110 and the bond structure 150.

The overall interface region may comprise the enclosed interface region 160 (or a plurality of enclosed interface regions), the peripheral interface region, and an interface region located between the degradation prevention structure 140 and the bond structure 150 (or between the degradation prevention structure 140 and the electrically conductive contact pad structure 110). The maximal lateral extension of the overall interface region may be a maximal lateral distance (e.g., the length of a straight lateral line) from a point located on the peripheral interface region (or on the degradation prevention structure 140, or on the enclosed interface region 160) to another point located on the peripheral interface region (or on the degradation prevention structure 140, or on the enclosed interface region 160). If the peripheral interface region laterally surrounds the degradation prevention structure 140 the maximal lateral extension of the overall interface region may be the maximal lateral extension of the peripheral interface region (e.g., the maximal lateral diameter of the peripheral interface region).

The maximal lateral extension of the enclosed interface region 160 may be a maximal lateral distance (e.g., the length of a straight lateral line) from a point located on the enclosed interface region 160 to another point located on the enclosed interface region 160. The maximal lateral extension of the enclosed interface region 160 may be the maximal lateral diameter of the enclosed interface region 160, for example.

An enclosed interface region whose maximal lateral extension is smaller than the maximal lateral extension of the overall interface region between the bond structure 150 and the electrically conductive contact pad structure 110 may allow larger manufacturing tolerances (e.g., larger tolerable lateral displacements) of the bond structure 150 from a prescribed position on the electrically conductive contact pad structure 110. For example, a larger offset of the bond structure 150 from a prescribed bonding position on the electrically conductive contact pad structure 110 can be accepted, because due to the larger overall interface region the bond structure 150 may still laterally extend over the entire enclosed interface region 160 and the degradation prevention structure 140 may still be located between a portion of the bond structure 150 and a portion of the electrically conductive contact pad structure 110. Consequently, the yield during manufacturing of the semiconductor device 100 may be increased.

For example, a total lateral area of the enclosed interface region 160 or of all enclosed interface regions may be larger than 60% (or larger than 70%, or larger than 80%) of a lateral area of the overall interface region between the electrically conductive contact pad structure 110 and the bond structure 150.

This may provide a sufficient electrical contact (e.g., a low enough contact resistance) and/or a sufficient adhesion between the bond structure 150 and the electrically conductive contact pad structure 110 even in the case of degradation (e.g., corrosion) that might occur at the peripheral interface region, for example. The lateral area of the overall interface region may be the sum of the total lateral area of the enclosed interface region (or of all enclosed interface regions), the lateral area of the peripheral interface region (or the lateral areas of a plurality of peripheral interface regions), and a lateral area of the degradation prevention structure 140.

For example, a total lateral area of the enclosed interface region 160 (or of all enclosed interface regions) may be at least as large as a minimal cross sectional area of the bond structure 150. A current-carrying capacity of the enclosed interface region 160 may then be at least as large as a current-carrying capacity of the bond structure 150. As the enclosed interface region 160 may carry as much current as the bond structure 150 during operating the semiconductor device 100, the degradation prevention structure 140 might not decrease the current-carrying capacity of the assembly of the bond structure 150 and the electrically conductive contact pad structure 110 if the lateral area of the enclosed interface region 160 is at least as large or larger than a minimal cross sectional area of the bond structure 150. For example, if the bond structure 150 comprises a bond wire, the lateral area of the enclosed interface region 160 may be at least as large as the minimal cross sectional area of the bond wire.

For example, a plurality of enclosed interface regions may be located between the electrically conductive contact pad structure 110 and the bond structure 150. Each enclosed interface region of the plurality of enclosed interface regions may be laterally surrounded by the degradation prevention structure 140. For example, the number of enclosed interface regions may be larger than 2 (or larger than 4, or larger than 8, or larger than 16, or larger than 25) and/or less than 100 (or less than 50, or less than 30). For example, the lateral shape of the enclosed interface regions may be squares, rectangles, rhombi, trapezoids, circles and/or ellipses.

The degradation prevention structure 140 may divide a front side surface of the electrically conductive contact pad structure 110 into a plurality of front side surface sectors. Each of these front side surface sectors may be laterally surrounded by the degradation prevention structure 140 so that the degradation prevention structure 140 may laterally extend between adjacent front side surface sectors. The front side surface of the electrically conductive contact pad structure 110 may be a lateral surface of the electrically conductive contact pad structure 110 closest to the bond structure 150. When the bond structure 150 is bonded to the electrically conductive contact pad structure 110 (e.g., to the front side surface of the electrically conductive contact pad structure 110), the front side surface sectors located between portions of the bond structure 150 and portions of the electrically conductive contact pad structure 110 can become enclosed interface regions. Other front side surface sectors may exclude any contact with the bond structure 150 (or may only be partially in contact with the bond structure 150) and might thus not become enclosed interface regions. Providing front side surface sectors may allow larger manufacturing tolerances (e.g., larger tolerable lateral displacements) of the bond structure 150 from a prescribed position on the electrically conductive contact pad structure 110. For example, if the position of the bond structure 150 deviates laterally from the prescribed position on the electrically conductive contact pad structure 110, a different front side surface sector (or different front side surface sectors) may become the enclosed interface region (or the enclosed interface regions). In spite of the lateral displacement of the bond structure 150, at least one enclosed interface region laterally surrounded by the degradation prevention structure 140 and vertically located between a portion of the bond structure 150 and a portion of the electrically conductive contact pad structure 110 may be formed during bonding because of the plurality of front side surface sectors.

Additionally, the semiconductor device 100 may further comprise a semiconductor package structure. The semiconductor package structure may comprise mold material (e.g., a mold compound). The enclosed interface region 160 may be separated from the mold material at least by the degradation prevention structure 140.

The mold material of the semiconductor package structure may comprise chemically active components that may be able to cause degradation (e.g., corrosion or other chemical reactions) at the interface between the bond structure 150 and the electrically conductive contact pad structure 110, for example. For example, an intermetallic phase material of an intermetallic phase region located at the interface between the bond structure 150 and the electrically conductive contact pad structure 110 may be susceptible to degradation caused by the mold material. The chemically active components may comprise (e.g., be) adhesion promoting chemicals (e.g., adhesion promoters), like sulphur, chlorine, and/or oxygen, for example. Adhesion promoting chemicals may provide an improved adhesion between the semiconductor package structure and a semiconductor die comprised by the semiconductor device and may thus reduce and/or prevent delamination of the semiconductor package structure from the semiconductor die.

By separating the enclosed interface region 160 from the mold material at least by the degradation prevention structure 140, degradation of the electrical contact and/or the adhesion between the bond structure 150 and the electrically conductive contact pad structure 110 may be prevented and/or at least be reduced. For example, it may be prevented, that the intermetallic phase material of the intermetallic phase region (and/or a material of the bond structure 150, and/or a material of the electrically conductive contact pad structure 110) located at the enclosed interface region(s) 160 may chemically react with a chemically active component of the mold material. Thus, a chemical reaction that may form substantially non-conductive material and/or low adhesive material at the enclosed interface region(s) 160 may be prevented. The enclosed interface region 160 may exclude any contact with the mold material of the semiconductor package structure.

For example, the mold material of the semiconductor package structure may be in contact with a portion of the electrically conductive contact pad structure 110 outside the enclosed interface region 160 and/or may be in contact with the bond structure 150. The mold material may protect the semiconductor device 100 from environmental influences, such as heat, low temperatures, moisture, mechanical impacts, and/or electrostatic discharges for example. The mold material may mechanically support (e.g., hold) the bond structure 150 by being formed around the bond structure 150 and may protect the bond structure 150 and/or the electrically conductive contact pad structure from delamination and/or ripping.

For example, the degradation prevention structure 140 may comprise a trench extending into the electrically conductive contact pad structure 110. The trench may interrupt an interface between the bond structure 150 and the electrically conductive contact pad structure 110, such that the enclosed interface region 160 may be laterally separated from a peripheral interface region by at least a width of the trench. Intermetallic phase material might not be formed at the interface between the trench and the bond structure 150 due to the absence of material of the electrically conductive contact pad structure 110.

A direct contact between bond structure 150 with at least the electrically conductive contact pad structure 110 may be needed for a degradation process to occur and/or to propagate. In addition, a degradation process may need the presence of an intermetallic phase material and/or a mold material of a semiconductor package structure, for example. For example, if a degradation process starts outsides the enclosed interface region and outside the degradation prevention structure 140 (e.g., at a peripheral interface region between the bond structure 150 and the electrically conductive contact pad structure 110), the degradation process may only propagate to the trench because the trench provides a discontinuity in the direct contact between the bond structure 150 and the electrically conductive contact pad structure 110. The degradation process might not propagate further to the enclosed interface region 160 due to the absence of material of the electrically conductive contact pad structure 110 at a top side of the trench.

For example, if the degradation process comprises a chemical reaction based on both the material of the bond structure 150 and the material of the electrically conductive contact pad structure, a reactant (e.g. the material of the electrically conductive contact pad structure 110) may be missing at the interface region between the trench and the bond structure 150. Hence, such a chemical reaction may stop at the trench.

For example, a minimal vertical distance between the degradation prevention structure 140 and a backside surface of the electrically conductive contact pad structure 110 may be larger than 100 nm (or larger than 200 nm, or larger than 500 nm, or larger than 1 µm).

For example, the portion (e.g., a first portion) of the electrically conductive contact pad structure 110 located vertically below the degradation prevention structure 140 may extend from the degradation prevention structure 140 to the backside surface of the electrically conductive contact pad structure 110. The electrically conductive contact pad structure 110 may comprise a second portion extending vertically from the enclosed interface region 160 to the backside surface of the electrically conductive contact pad structure 110. The first portion of the electrically conductive contact pad structure 110 may laterally surround the second portion. The first portion of the electrically conductive contact pad structure 110 may be in contact with the second portion.

If the degradation prevention structure 140 comprises a trench, the trench may extend from the front side surface of the electrically conductive contact pad structure 110 into the electrically conductive contact pad structure 110. A vertical extension of the degradation prevention structure 140 (e.g., the trench) may be larger than 500 nm (or larger than 1 µm, or larger than 2 µm, or larger than 4 µm) and/or may be smaller than 10 µm (or 8 µm, or 5 µm), for example. The vertical extension of the trench may be at least smaller than a thickness of the electrically conductive contact pad structure 110. The first portion of the electrically conductive contact pad structure 110 may then extend vertically from the trench (e.g., from the bottom of the trench) to the backside surface of the electrically conductive contact pad structure 110. The minimal vertical extension of the first portion of the electrically conductive contact pad structure 110 may then be larger than 100 nm (or larger than 200 nm, or larger than 500 nm, or larger than 1 µm), for example.

A maximal thickness of the electrically conductive contact pad structure 110 may be larger than 2 µm (or larger than 3 µm, or larger than 4 µm, or larger than 6 µm) and may be less than 100 µm (or less than 50 µm, or less than 20 µm, or less than 10 µm).

The backside surface of the electrically conductive contact pad structure 110 may be a lateral surface of electrically conductive contact pad structure 110 furthest from the bond structure 150 and/or opposite to the front side surface of the electrically conductive contact pad structure 110. For example, the backside surface of the electrically conductive contact pad structure 110 may be a lateral surface of the electrically conductive contact pad structure 110 located closest to a semiconductor substrate comprised by the semiconductor device 100.

By keeping a large enough vertical distance between the degradation prevention structure 140 and the backside surface of the electrically conductive contact pad structure 110, the electrical connectivity (e.g., the resistance) between the bond structure 150 and electrical structures (e.g., vertical wiring elements and/or electrical element structures of the semiconductor device 100) connected to the backside surface of the electrically conductive contact pad structure 110 may be less affected and/or unaffected by the degradation prevention structure 140. The second portion of the electrically conductive contact pad structure 110 extending vertically from the enclosed interface region 160 to the backside surface of the electrically conductive contact pad structure 110 and being optionally in contact with the first portion of the electrically conductive contact pad structure 110 may further provide and/or improve the electrical connectivity to electrical structures connected to the backside surface of the electrically conductive contact pad structure 110. The second portion of the electrically conductive contact pad structure 110 may laterally extend below the entire enclosed interface region 160, for example.

Optionally, the trench may be filled with a solid dielectric material. The solid dielectric material may comprise silicon oxide (e.g., silicon dioxide and/or silicon monoxide), silicon nitride, and/or other inorganic or organic insulating solid materials, for example. Alternatively, a cavity may be located in the trench. The cavity may be filled with a gas that was applied to the semiconductor device 100 during bonding the bond structure 150 to the electrically conductive contact pad structure 110, for example. This gas may comprise nitrogen, hydrogen, and/or other gases free of oxygen, for example.

A trench filled with a solid dielectric material may comprise a smaller width than a trench with a cavity, for example. The solid dielectric material may avoid or prevent that electrically conductive material (e.g., material of the electrically conductive contact pad structure 110 and/or material of the bond structure 150) is moved (e.g., splashed) into the trench during bonding. Thus, it is prevented that electrically conductive material may close the trench and may provide a path for a degradation process from outside the enclosed interface region 160 to the enclosed interface region 160. A smaller width of the trench may result in a larger total lateral area of the enclosed interface region(s) and may thus provide a lower electrical resistance and/or a higher adhesion between the bond structure 150 and the electrically conductive contact pad structure 110.

A trench with a cavity may comprise a larger width compared to a trench filled with a solid dielectric material. However, the trench with the cavity may avoid an additional manufacturing step for filling the trench with solid dielectric material.

For example, a minimal width of the degradation prevention structure 140 may be larger than 1 µm (or larger than 1.5 µm, or larger than 2 µm, or larger than 4 µm, or larger than 8 µm). A maximal width of the degradation prevention structure 140 may be smaller than 20 µm (or smaller than 15 µm, or smaller than 10 µm, or smaller than 5 µm, or smaller than 3 µm), for example.

A larger width of the degradation prevention structure 140 may provide a higher protection against degradation processes to the enclosed interface region 160. A smaller width of the degradation prevention structure 140 may provide a lower electrical resistance and/or a higher adhesion between the bond structure 150 and the electrically conductive contact pad structure 110.

Alternatively or additionally to a degradation prevention structure 140 comprising a trench, the degradation prevention structure 140 may comprise a solid dielectric material structure formed on a surface of the electrically conductive contact pad structure 110.

For example, the solid dielectric material of the solid dielectric material structure may be stiffer than the material of the electrically conductive contact pad structure 110 and/or the material of the bond structure 150 during bonding at bonding temperature. During attaching the bond structure 150 to the electrically conductive contact pad structure 110 (e.g., during bonding), the solid dielectric material structure may be pressed into the electrically conductive contact pad structure 110 and/or into the bond structure 150, such that the solid dielectric material structure may laterally surround the enclosed interface region(s) located vertically between the bond structure 150 and the electrically conductive contact pad structure 110. The solid dielectric material of the solid dielectric material structure may comprise silicon oxide (e.g., silicon dioxide and/or silicon monoxide), silicon nitride, and/or other inorganic or organic insulating solid materials, for example. A vertical extension of the degradation prevention structure 140 (e.g., the solid dielectric material structure) may be larger than 500 nm (or larger than 1 µm, or larger than 2 µm, or larger than 4 µm) and/or may be smaller than 10 µm (or 8 µm, or 5 µm), for example.

By providing a solid dielectric material structure formed on a surface of the electrically conductive contact pad structure 110, a manufacturing step for forming a trench in the electrically conductive contact pad structure may be avoided and manufacturing of the semiconductor device 100 may become more time efficient and/or more cost efficient. Moreover, a solid dielectric material structure may affect less the electrical connectivity to electrical structures connected to the backside surface of the electrically conductive contact pad structure 110 than a trench.

For example, the degradation prevention structure 140 may comprise an electrically conductive layer. The electrically conductive layer may comprise an electrically conductive material different from a material of the electrically conductive contact pad structure 110 and different from a material of the bond structure 150. The electrically conductive material of the electrically conductive layer may be different from the first predominant electrically conductive material of the electrically conductive contact pad structure 110 and may be different from the second predominant electrically conductive material of the bond structure, for example.

The electrically conductive layer may serve as a diffusion stopper for preventing atoms from diffusing from the bond structure 150 to the electrically conductive contact pad structure 110 and/or vice versa, for example. In this way, a forming of an intermetallic phase material based on the material of the bond structure 150 and on the material of the electrically conductive contact pad structure 110 at an interface region between the bond structure 150 and the degradation prevention structure 140 may be prevented. Due to the absence of intermetallic phase material at the interface region between the bond structure 150 and the degradation prevention structure 140, a degradation process originating outside the enclosed interface region 160 and outside the degradation prevention structure 140 (e.g., at a peripheral interface region) may be prevented from propagating to the enclosed interface region 160.

The electrically conductive layer may also serve as an adhesion promoter for increasing the adhesion of the bond structure 150 to the electrically conductive contact pad structure 110 and/or for increasing the adhesion of a semiconductor package material (e.g., mold material) to a semiconductor die comprised by the semiconductor device 100.

Additionally or alternatively to an electrically conductive layer, the degradation prevention structure 140 may comprise a thin ceramic layer that may also serve as a diffusion stopper and/or an adhesion promoter similarly to an electrically conductive layer.

For example, the electrically conductive layer may comprise titanium (Ti), titanium nitride (TiN), titanium-tungsten (TiW), tungsten (W), nickel (Ni), palladium (Pd), and/or any alloy thereof. A thin ceramic layer may comprise titanium nitride (TiN) and/or tantalum nitride (TaN).

The electrically conductive layer and/or the thin ceramic layer may also be more ductile (e.g., less brittle) then dielectric solid materials (e.g., silicon oxides, silicon nitride, and/or other inorganic insulating solid materials). The electrically conductive layer and/or the thin ceramic layer may thus be less susceptible towards bonding forces and initiation of cracks caused during bonding.

For example, a thickness of the electrically conductive layer (and/or of the thin ceramic layer) may be smaller than 1 μm (or smaller than 600 nm, or smaller than 400 nm, or smaller than 200 nm) and/or may be larger than 50 nm (or larger than 100 nm, or larger than 300 nm, or larger than 500 nm).

Optionally, the electrically conductive layer (and/or the thin ceramic layer) may extend laterally from the enclosed interface region 160 to at least an edge of the electrically conductive contact pad structure 110. For example, the electrically conductive layer (and/or the thin ceramic layer) may extend laterally from the enclosed interface region 160 to all edges of the electrically conductive contact pad structure 110. The edges of the electrically conductive contact pad structure 110 may be lateral limits of the electrically conductive contact pad structure 110 (e.g., a border line between the electrically conductive material of the electrically conductive contact pad structure 110 and insulating or semiconducting material of a semiconductor die).

Additionally, a plurality of enclosed interface regions may be located between the bond structure 150 and the electrically conductive contact pad structure 110 and each enclosed interface region may be laterally surrounded by the electrically conductive layer (and/or the thin ceramic layer).

An electrically conductive layer (and/or a thin ceramic layer) extending laterally from the enclosed interface region 160 to at least an edge of the electrically conductive contact pad structure 110 (and/or to all edges of the electrically conductive contact pad structure 110) may reduce and/or prevent a degradation process (e.g., corrosion) from occurring anywhere on the front side surface of the electrically conductive contact pad structure 110. Thus, not only the enclosed interface region(s) 160 but also the rest of the front side surface of the electrically conductive contact pad structure 110 may be protected from degradation (e.g., from corrosion).

According to an example, the bond structure 150 comprises a bond wire and a first bond ball and a second bond ball. The first bond ball is located on an electrically conductive contact pad structure of a wiring layer stack of the semiconductor device 100 and the second bond ball is located on contact pad of a lead frame of the semiconductor device 100. In another example, the semiconductor device 100 is flip-chip mounted to a circuit board and the bond structure 150 is a bond ball located between the electrically conductive contact pad structure 110 of a wiring layer stack of the semiconductor device 100 and a pad (e.g., a foot print) located on the circuit board.

Vertical directions, vertical dimensions (e.g., depths), thicknesses of regions and/or of layers, and thicknesses of structures may, for example, be measured orthogonal to the front side surface of the electrically conductive contact pad structure 110 (and/or orthogonal to a front side surface of a semiconductor substrate comprised by the semiconductor device 100). Lateral directions and lateral dimensions (e.g., lengths and widths) may be measured in parallel to the front side surface of the electrically conductive contact pad structure 110 (and/or in parallel to a front side surface of a semiconductor substrate comprised by the semiconductor device 100). If it is referred to a length and/or to a width of a region, of an area, of a structure (e.g., of the degradation prevention structure 140, or of the trench comprised by the degradation prevention structure 140) and/or of a layer, the length designates the longer lateral dimension and the width designates the shorter lateral dimension of the structure and/or of the layer, for example.

For example, in case of a rectangular lateral shape, a width of the rectangular lateral shape may refer to the minimal distance between any pair of parallel edges of the rectangular lateral shape. In case of an annular lateral shape, a lateral ring shape, and/or a lateral loop shape (e.g., a ring shaped degradation prevention structure 140 laterally surrounding the enclosed interface region 160), a width may refer to the difference between the outer circumference and the inner circumference of the annular lateral shape, of the lateral ring shape, and/or of the lateral loop shape, respectively.

In vertical direction and/or in lateral direction the width of a region, of a structure, and/or of a layer may vary. In this case, the maximal width of the region, of the structure, and/or of the layer may refer to the largest width of the region, of the structure, and/or of the layer, respectively, occurring along the vertical extension and/or the lateral extension of the region, of the structure, and/or of the layer, respectively. Correspondingly, the minimal width of a region, of a structure, and/or of a layer may refer to the smallest width of the region, of the structure, and/or of the layer, respectively, occurring along the vertical extension and/or the lateral extension of the region, of the structure, and/or of the layer, respectively.

The electrically conductive contact pad structure 110 may be electrically connected to one or more doping regions (e.g. source or drain doping regions of transistor structures) of a semiconductor substrate of the semiconductor device 100 through one or more wiring structures within a wiring layer stack of the semiconductor device 100 formed on the semiconductor substrate. The wiring layer stack may comprise one or more lateral wiring layers and one or more vertical wiring layers and a pad metallization layer. A lateral wiring layer (e.g. metal layer) may be a layer for implementing lateral electrical connections between vertical electrical connections (vias) connecting lateral wiring layers. A vertical wiring layer (e.g. via layer, for example, an inter-metal dielectric layer or a pre-metal dielectric layer) may be a layer for implementing vertical electrical connections (vias) between lateral wiring layers or a lateral wiring layer and a doping region of the semiconductor substrate.

The semiconductor substrate may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)- based semiconductor substrate, or gallium arsenide (GaAs)-based semiconductor substrate, or a gallium nitride (GaN)-based semiconductor substrate. The semiconductor substrate may be a semiconductor wafer or a semiconductor die.

The semiconductor device 100 may be a processor device, a memory device, a sensor device and/or a power semiconductor device, for example. A power semiconductor device or an electrical structure (e.g. transistor arrangement of the semiconductor device and/or diode arrangement of the semiconductor device) of the power semiconductor device may have a breakdown voltage or blocking voltage of more than 10 V, more than 100 V or more than 500 V or more than 1000 V, for example.

Figure 2A:
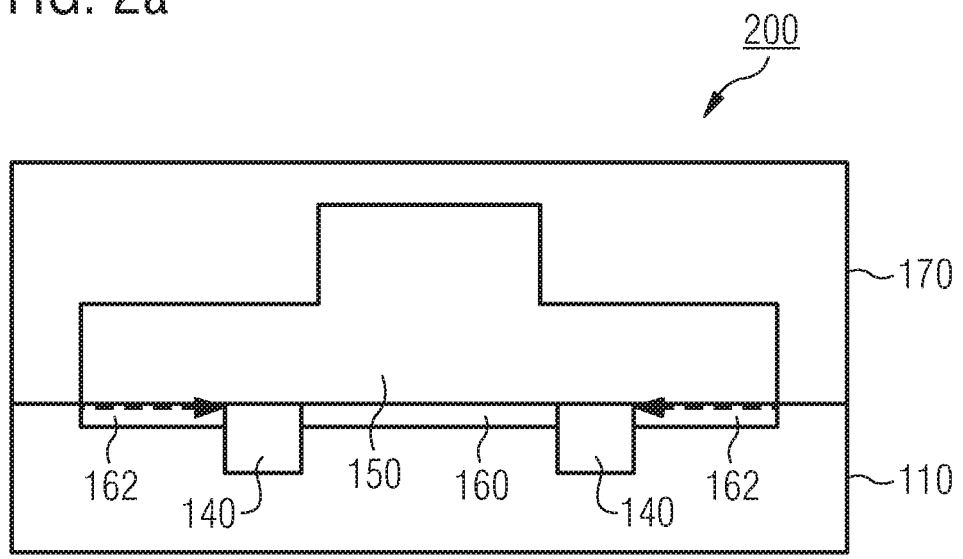
FIG. 2a shows a schematic cross section of a portion of a semiconductor device through an electrically conductive contact pad structure, a bond structure, and a degradation prevention structure.

FIG. 2a shows a schematic cross section of a portion of a semiconductor device 200 through an electrically conductive contact pad structure 110, a bond structure 150, and a degradation prevention structure 140 according to an embodiment. The semiconductor device 200 may be similar to the semiconductor device 100 of FIG. 1.

A degradation prevention structure 140 of the semiconductor device 200 is vertically located between a bond structure 150 and an electrically conductive contact pad structure 110 of the semiconductor device 200 and surrounds laterally an enclosed interface region 160 located between the bond structure 150 and the electrically conductive contact pad structure 110. The degradation prevention structure 140 of the semiconductor device 200 is a trench. The trench extends from a front side surface of the electrically conductive contact pad structure 110 into the electrically conductive contact pad structure 110 but not through the electrically conductive contact pad structure 110. A cavity is located in the trench. The cavity may be filled with a gas that was applied to the semiconductor device 100 during attaching the bond structure 150 to the electrically conductive contact pad structure 110. Alternatively, the trench may be filled with a dielectric solid material.

Figure 2B:
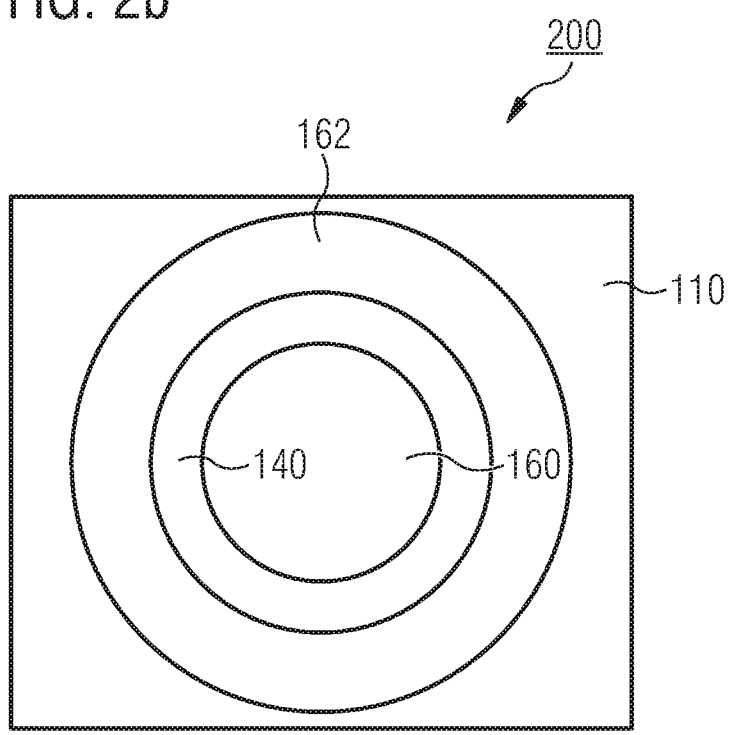

As displayed in FIG. 2b showing a schematic top view of the portion of the semiconductor device 200, the degradation prevention structure 140 comprises an annular lateral shape and laterally surrounds the enclosed interface region 160 that comprises a lateral shape of a circle. However, also different lateral geometries may be possible, for example, ellipses, rectangles, squares, trapezoids, etc. A peripheral interface region 162 is located vertically between the bond structure 150 and the electrically conductive contact pad structure 110 and laterally surrounds the degradation prevention structure 140.

The electrically conductive contact pad structure 110 comprises an enclosed intermetallic phase region at the enclosed interface region 160. For example, the enclosed interface region 160 may be and/or coincide with the enclosed intermetallic phase region. Moreover, the electrically conductive contact pad structure 110 comprises a peripheral intermetallic phase region at the peripheral interface region 162. For example, the peripheral interface region 162 may be and/or coincide with the peripheral intermetallic phase region.

The semiconductor device 200 comprises a semiconductor package structure 170 that is in contact with the bond structure 150 and is in contact with the electrically conductive contact pad structure 110 and may be in contact with a portion of material of the peripheral intermetallic phase region. The semiconductor package structure 170 may comprise mold material. Due to the mold material being in contact with material of the peripheral intermetallic phase region a degradation process may be initiated at the outer lateral circumference of the peripheral interface region 162 at the front side surface of the electrically conductive contact pad structure 110. This degradation process may propagate towards the degradation prevention structure 140 as is indicated by the dashed arrows in FIG. 2a. The degradation prevention structure 140 may then stop the propagation of the degradation process due to the absence of intermetallic phase material at the interface region between the degradation prevention structure 140 and the bond structure 150.

For example, FIG. 2a shows a cross section of a pad (e.g., an electrically conductive contact pad structure) with a groove (e.g., a degradation prevention structure comprising a trench with a cavity) according to an embodiment of the present disclosure. The groove may prevent direct contact between a copper-wire (e.g., a bond structure) and an aluminum-pad (e.g., an electrically conductive contact pad structure comprising aluminum). This may exclude the formation of aluminum-copper intermetallic phases. If there are no intermetallic phases, a corrosion reaction (e.g., a degradation process) might not take place. At the same time, if the groove comprises a closed (lateral) shape, no transport of aggressive elements to the middle of bond (e.g., to the enclosed interface region) may be possible. Degradation may stop just before the groove. The groove may work like a sealing ring.

New (e.g., additional) materials might not be added to the semiconductor device 200 and qualification efforts may be minimal. Only a few additional lithography operations and/or minimal changes of working plans may be needed. The electrical connectivity of the pad may be unchanged and redesigns of chip layouts may be avoided. The degradation prevention structure may allow rich variations of geometry and may be adapted to different requirements (e.g., different geometrical requirements).

Geometry of the groove may fulfill several requirements. The groove may be deep enough in order not be destroyed during bonding. The depth of groove may be smaller than a thickness of the pad. Otherwise electrical connectivity may be changed and chip layout changes may be carried out. The groove may be wide enough in order not to be completely filled by splashing of aluminum during bonding, but the width may be narrow enough to avoid reducing a contact area of the bonded wire. For example, the groove may reduce the contact area of the bond structure and the electrically conductive contact pad structure by less than 30%. The groove may be sufficiently located away from the outer edge of the bond (e.g., a radius of the groove may be sufficiently small).

Bonding may have some (lateral) offset from a prescribed position (e.g., about 25% from bond ball dimensions). For example, the offset may amount to 25% of a bond ball diameter prior to bonding. If the groove radius is sufficiently small, then a shifted bond position may still cover completely a central bond area (e.g., the enclosed interface region) preventing its direct contact to molding compound (e.g., mold material of a semiconductor package structure). This may prevent a diffusion path from being opened and may hence prevent a loss of the sealing effect. Groove geometries may be designed using mechanical simulations, for example.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3a-11).

Figure 3A:
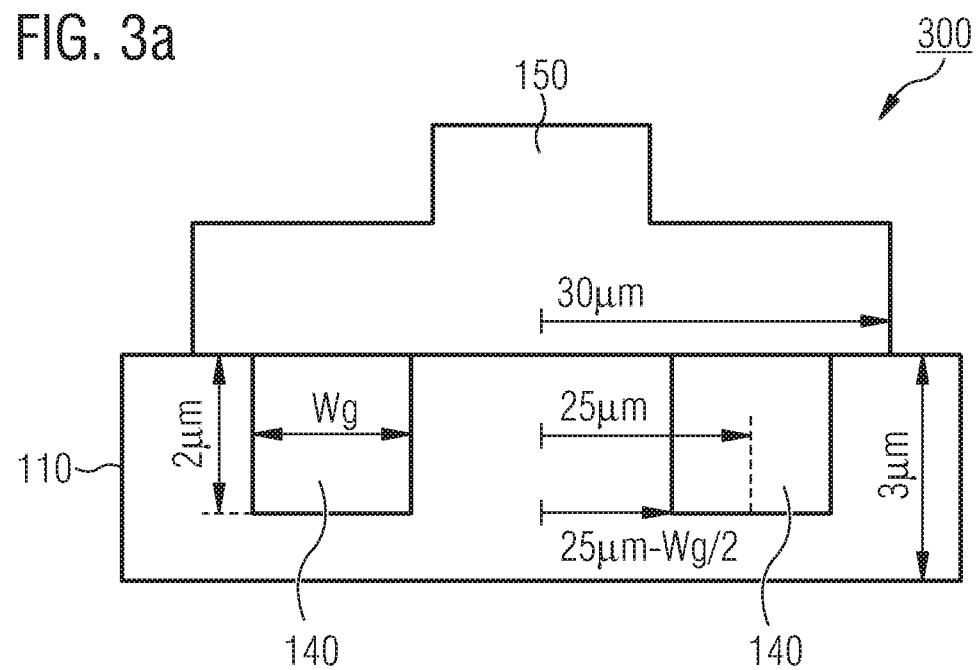
FIG. 3a shows a schematic cross section of a portion of a semiconductor device through an electrically conductive contact pad structure, a bond structure, and a degradation prevention structure at an initial bonding step.
Figure 3B:
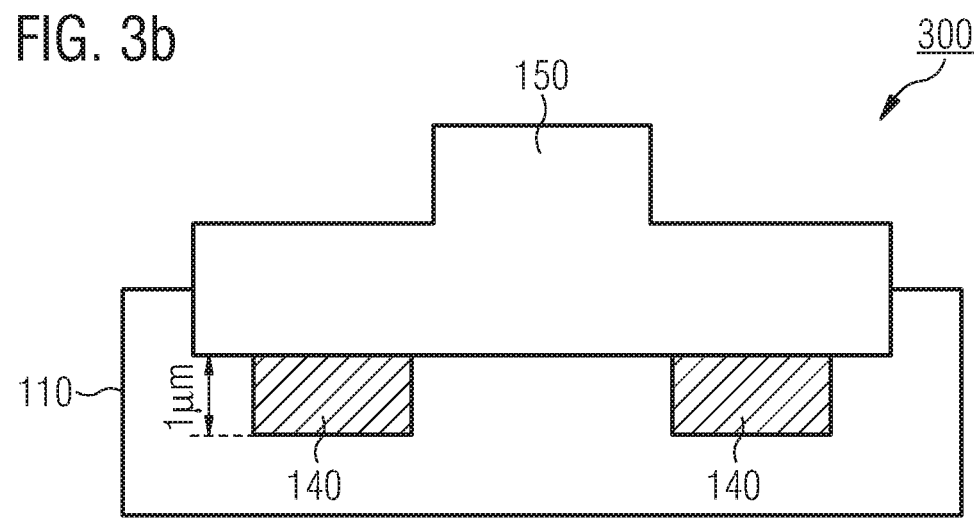
FIG. 3b shows a schematic cross section of a portion of a semiconductor device through an electrically conductive contact pad structure, a bond structure, and a degradation prevention structure after bonding.

FIG. 3a shows a schematic cross section of a portion of a semiconductor device 300 through an electrically conductive contact pad structure 110, a bond structure 150, and a degradation prevention structure 140 at an initial bonding step according to an embodiment. FIG. 3b shows a schematic cross section of the portion of the semiconductor device 300 through the electrically conductive contact pad structure 110, the bond structure 150, and the degradation prevention structure 140 after bonding. The semiconductor device 300 may be similar to the semiconductor device 200 of FIGS. 2a, b.

The electrically conductive contact pad structure 110 of the semiconductor device 300 comprises a trench (e.g., a groove). The trench comprises an annular lateral shape. A cavity is located in the trench. FIG. 3a and FIG. 3b illustrate a dimensioning of the trench. The dimensioning of the trench may be based on the assumption that metals during plastic deformation may substantially behave like incompressible materials. The trench may be dimensioned in the way, that the volume of the trench (e.g., a volume of the cavity located in the trench) after attaching the bond structure may be larger than a volume of a portion of the electrically conductive contact pad structure 110 displaced during attaching the bond structure 150 to the electrically conductive contact pad structure 110 (e.g., the volume of the trench after attaching the bond structure 150 may be larger than a volume of splashed aluminum).

In this example, a thickness of the electrically conductive contact pad structure 110 (e.g., a pad thickness) is 3 µm, a penetration distance $d_{pen}$ during bonding is 1 µm, a depth of the trench before bonding is 2 µm such that a depth $d_{trench}$ of the trench after bonding is 1 µm, a radius $r_{tot}$ of the overall interface region between the bond structure 150 and the electrically conductive contact pad structure 110 (e.g., a radius of the contact area after bonding) is 30 µm, and a mean radius $r_{trench}$ of the annular lateral shape of the trench is 25 µm.

The trench width $W_g$ (e.g., the width of the degradation prevention structure 140) may be obtained from the following quadratic equation, where the volume $V_{displaced}$ of the portion of the electrically conductive contact pad structure 110 displaced during bonding has been set equal to the volume $V_{trench\ after\ bonding}$ of the trench after bonding:

$$V_{displaced} = V_{trench\ after\ bonding}$$

$$d_{pen} \cdot \pi \cdot \left(r_{trench} - \frac{W_g}{2}\right)^2 = 2 \cdot \pi \cdot r_{trench} \cdot d_{trench} \cdot W_g$$

$$1.0\ \mu m \cdot \pi \cdot \left(25\ \mu m - \frac{W_g}{2}\right)^2 = 2 \cdot \pi \cdot 25\ \mu m \cdot 1.0\ \mu m \cdot W_g$$

Solving this equation for the trench width $W_g$, yields a trench width $W_g$ of approximately 8.6 µm.

In this example, the lateral area occupied by the trench (e.g., the groove's area) is relatively large compared to the lateral area of the overall interface region (e.g., the whole contact area comprising the entire contact area between the bond structure 150 and the electrically conductive contact pad structure 110 and the interface area between the bond structure 150 and the degradation prevention structure 140):

$$\frac{2 \cdot \pi \cdot r_{trench} \cdot W_g}{\pi \cdot r_{tot}^2} = (2 \cdot \pi \cdot 25 \cdot 8.6)/(\pi \cdot 30^2) \approx 48\%$$

In other examples, the trench may comprise a larger depth, such that the width of the trench and thus the lateral area occupied by the trench may be decreased.

More details and aspects are mentioned in connection with the embodiments described above or below. The embodiment shown in FIGS. 3a, b may comprise one or more optional additional features corresponding to one or more aspects mentioned in connection with the proposed concept or one or more embodiments described above (e.g. FIGS. 1-2) or below (e.g. FIGS. 4-11).

Figure 4:
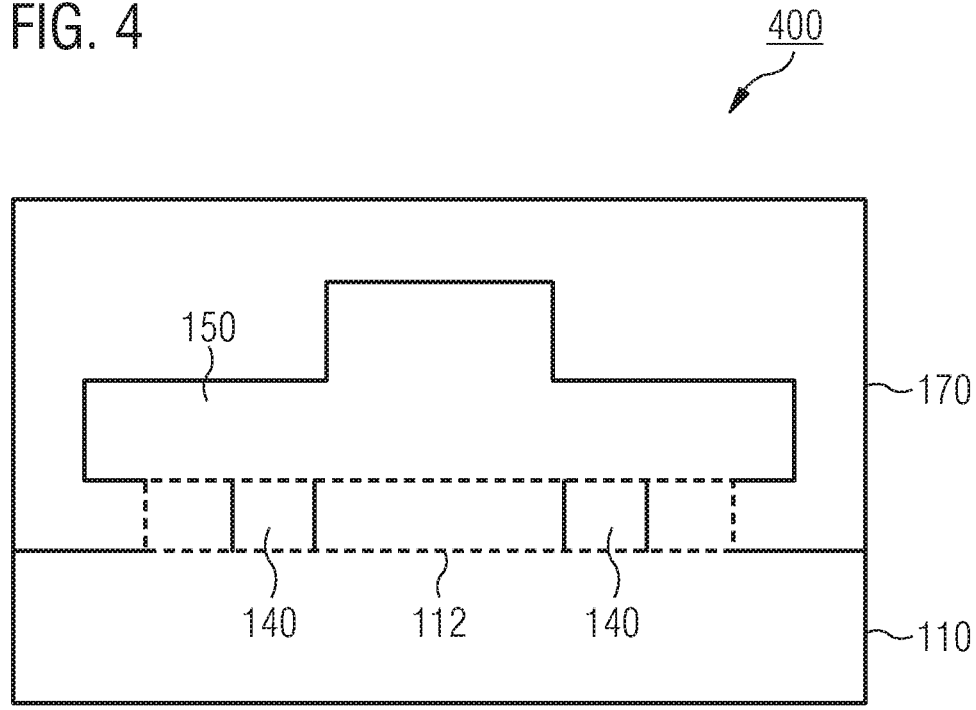
FIG. 4 shows a schematic cross section of a portion of a semiconductor device through an electrically conductive contact pad structure, a bond structure, and a degradation prevention structure.

FIG. 4 shows a schematic cross section of a portion of a semiconductor device 400 through an electrically conductive contact pad structure 110, a bond structure 150, and a degradation prevention structure 140 according to an embodiment. Additionally, the semiconductor device 400 comprises a semiconductor package structure 170 that may comprise mold material. The semiconductor device 400 may be similar to the semiconductor device 200 of FIG. 2 and/or may be similar to the semiconductor device 300 of FIG. 3.

The degradation prevention structure 140 comprises a trench. A cavity is located in the trench. Material 112 of the electrically conductive contact pad structure (e.g., aluminum) is selectively deposited on the electrically conductive contact pad structure 110 (e.g., the pad) to form the trench and to provide a same (or similar) sealing effect as grooves. For example, the enclosed interface region may be vertically located between a first portion of the additionally deposited material 112 of the electrically conductive contact pad structure and the bond structure 150. The peripheral interface region may be vertically located between a second portion of the additionally deposited material 112 of the electrically conductive contact pad structure 110 and the bond structure 150. An area located between the first portion and the second portion of the additionally deposited material 112 of the electrically conductive contact pad structure 110 may be left free, such that a trench is formed between the first and the second portion of the additionally deposited material 112 of the electrically conductive contact pad structure 110. This trench may then laterally surround the enclosed interface region and may laterally separate the enclosed interface region from the peripheral interface region. In this way, a partial etch of the pad (e.g., the electrically conductive contact pad structure 110) may be avoided.

For example, FIG. 4 shows a design (e.g., a variant) with selectively deposited aluminum, which may provide the same (or similar) sealing effect (as the degradation prevention structure 140 of the semiconductor device 200 of FIG. 2).

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIGS. 1-3b) or below (e.g. FIGS. 5-11).

Figure 5:
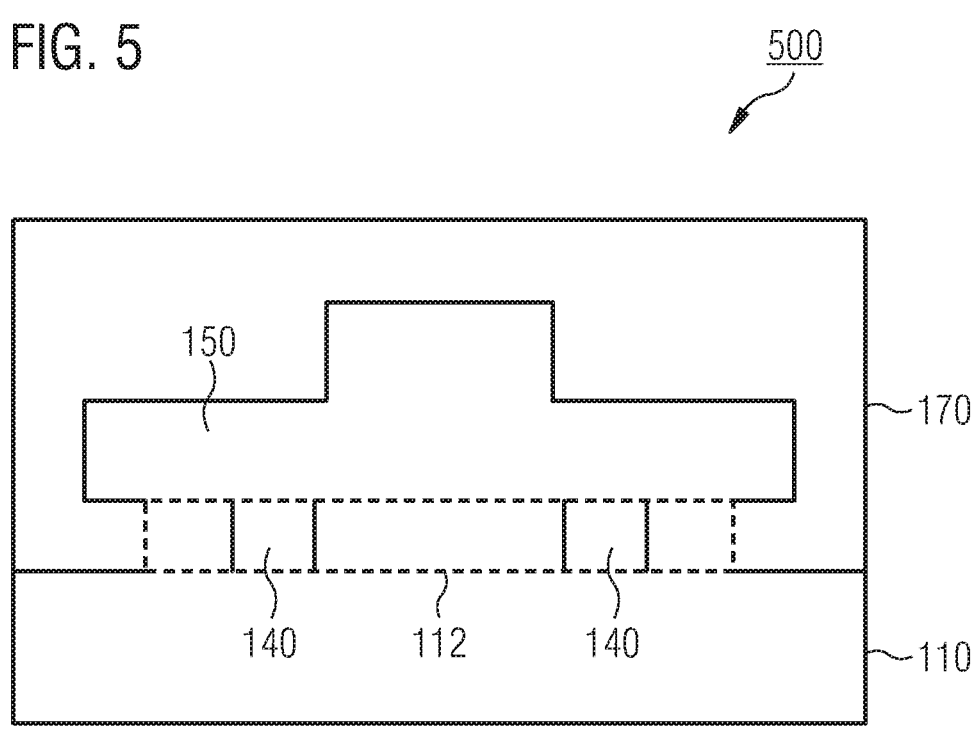
FIG. 5 shows a schematic cross section of a portion of a semiconductor device through an electrically conductive contact pad structure, a bond structure, and a degradation prevention structure.

FIG. 5 shows a schematic cross section of a portion of a semiconductor device 500 through an electrically conductive contact pad structure 110, a bond structure 150, and a degradation prevention structure 140 according to an embodiment. Additionally, the semiconductor device 400 comprises a semiconductor package structure 170 that may comprise mold material. The semiconductor device 500 may be similar to the semiconductor device 400 of FIG. 4.

Compared to embodiments whose degradation prevention structure may be a trench with a cavity that may be filled with a gas, which was in the bonding tool chamber, the degradation prevention structure 140 of the semiconductor device 500 is a trench filled with a solid dielectric material. The trench filled with solid dielectric material may prevent filling of the trench with material of the electrically conductive contact pad structure 110 displaced during bonding. For example, a complete filling of the groove by splashed aluminum during bonding may be prevented. Thus, a destruction of the trench (e.g., the groove) and a loss of the sealing effect (e.g., a loss of the degradation prevention) may be prevented by filling the trench with solid dielectric material.

A trench filled with solid dielectric material may comprise a smaller cross section and/or a smaller volume than a trench with a cavity. For example, the vertical cross sectional area of a trench filled with solid dielectric material may be at least ten times smaller than the cross sectional area of a trench with a cavity. For example, the width of a trench filled with solid dielectric material may be at least three times (or at least four times) smaller the width of a trench with a cavity. Consequently, a trench filled with solid dielectric material may only slightly reduce an electrical contact area between the bond structure 150 and the electrically conductive contact pad structure 110 (e.g., a wire-pad contact area). The solid dielectric material may comprise a silicon oxide $SiO_x$ (e.g., silicon monoxide and/or silicon dioxide) and/or other inorganic or organic insulating solid materials. Alternatively, the trench may also be filled with a semiconductor material (e.g., polysilicon).

For example, FIG. 5 displays grooves filled with dielectrics to avoid filling of the grooves by splashed aluminum.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-4) or below (e.g. FIGS. 6a-11).

Figure 6A:
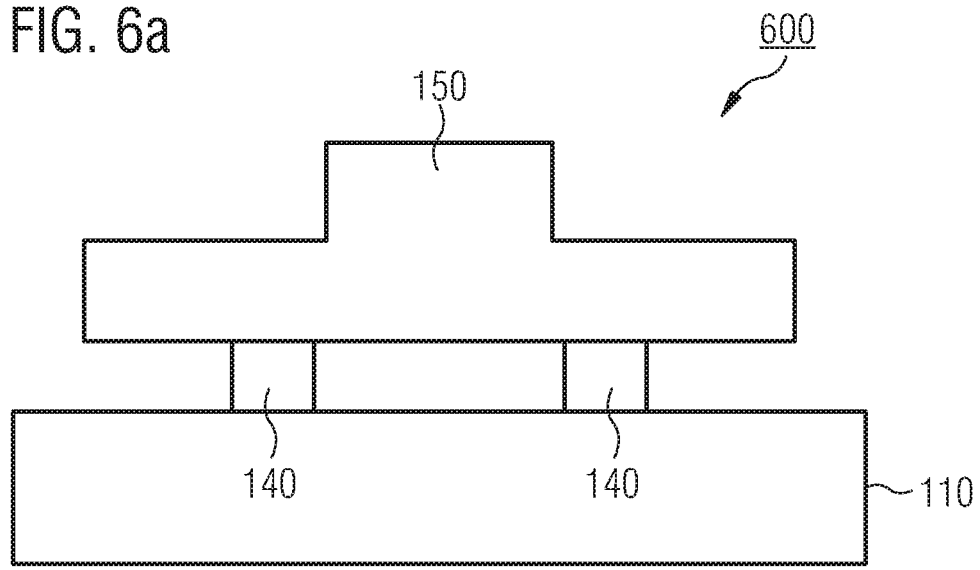
FIG. 6a shows a schematic cross section of a portion of a semiconductor device through an electrically conductive contact pad structure, a bond structure, and a degradation prevention structure at an initial bonding step.

FIG. 6a shows a schematic cross section of a portion of a semiconductor device 600 through an electrically conductive contact pad structure 110, a bond structure 150, and a degradation prevention structure 140 at an initial bonding step. The semiconductor device 600 may be similar to the semiconductor device 100 of FIG. 1.

The degradation prevention structure 140 of the semiconductor device 600 comprises a solid dielectric material structure formed on a surface (e.g., the front side surface) of the electrically conductive contact pad structure 110. At the initial bonding step, the solid dielectric material structure laterally surrounds an enclosed front side surface sector of the electrically conductive contact pad structure 110. Optionally, the solid dielectric material structure may also surround a plurality of front side surface sectors of the electrically conductive contact pad structure 110 and may laterally extend between adjacent front side surface sectors.

Deposition of structured dielectrics may provide a sealing effect (e.g., a degradation prevention) without grooves (e.g., without trenches extending into the electrically conductive contact pad structure 110). Solid dielectric materials (e.g., $SiO_x$) may be stiffer than a material of the electrically conductive contact pad structure 110 (e.g., aluminum) at bonding temperature. Therefore during bonding, the solid dielectric material structure (e.g., structured layers of dielectrics) can be pressed into the electrically conductive contact pad structure 110 separating a central area (e.g., the enclosed interface region 160) of the bond structure 150 from the outer edge of the bond structure 150. This can prevent degradation (e.g., corrosion) at the enclosed interface region and may provide a sealing effect.

Figure 6B:
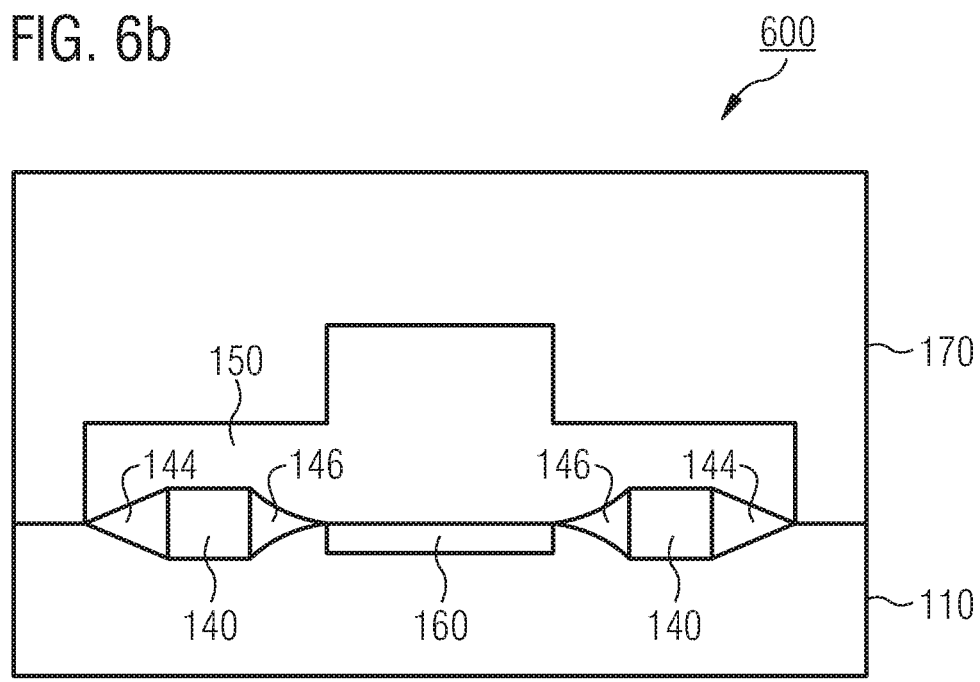
FIG. 6b shows a schematic cross section of a portion of a semiconductor device through an electrically conductive contact pad structure, a bond structure, and a degradation prevention structure after bonding.

FIG. 6b shows a schematic cross section of the portion of the semiconductor device 600 through the electrically conductive contact pad structure 110, the bond structure 150, and the degradation prevention structure 140 after bonding and after forming a semiconductor package structure 170 in contact with the electrically conductive contact pad structure 110 and with the bond structure 150. The solid dielectric material structure is partially pressed into the bond structure 150 and is partially pressed into the electrically conductive contact pad structure 110. A portion of the bond structure 150 is in contact with the electrically conductive contact pad structure 110 at a peripheral interface region laterally surrounding the solid dielectric material structure. A peripheral intermetallic phase region may be located at the peripheral interface region. A first cavity 144 is located laterally between the peripheral interface region and the solid dielectric material structure. The first cavity 144 may laterally surround the solid dielectric material structure and may additionally support degradation prevention (e.g., due to the absence of intermetallic phase material at the first cavity 144).

The bond structure 150 is in contact with the electrically conductive contact pad structure 110 at the enclosed interface region 160 (or may optionally be in contact with the electrically conductive contact pad structure 110 at a plurality of enclosed interface regions). The enclosed interface region(s) may be formed during bonding by contacting an enclosed front side surface sector (or a plurality of enclosed front side surface sectors, respectively) of the electrically conductive contact pad structure 110 with the bond structure 150. An enclosed intermetallic phase region may be located at the enclosed interface region 160 (or a plurality of enclosed intermetallic phase regions may be located at the enclosed interface regions of the plurality of enclosed interface regions, respectively). A second cavity 146 is located laterally between the solid dielectric material structure and the enclosed interface region 160 and may laterally surround the enclosed interface region 160. The second cavity 146 may additionally support degradation prevention (e.g., due to the absence of intermetallic phase material at the second cavity 146).

Alternatively, the first cavity 144 and/or the second cavity 146 may be filled with material of the electrically conductive contact pad structure 110 and/or with material of the bond structure 150.

For example, FIG. 6a shows structured dielectrics (e.g., a solid dielectric material structure) before bonding and FIG. 6b shows structured dielectrics after bonding. The structured dielectrics can provide a sealing effect (e.g., a degradation prevention of the contact between the bond structure 150 and the electrically conductive contact pad structure 110).

More details and aspects are mentioned in connection with the embodiments described above or below. The embodiment shown in FIGS. 6a, b may comprise one or more optional additional features corresponding to one or more aspects mentioned in connection with the proposed concept or one or more embodiments described above (e.g. FIGS. 1-5) or below (e.g. FIGS. 7-11).

Figure 7:
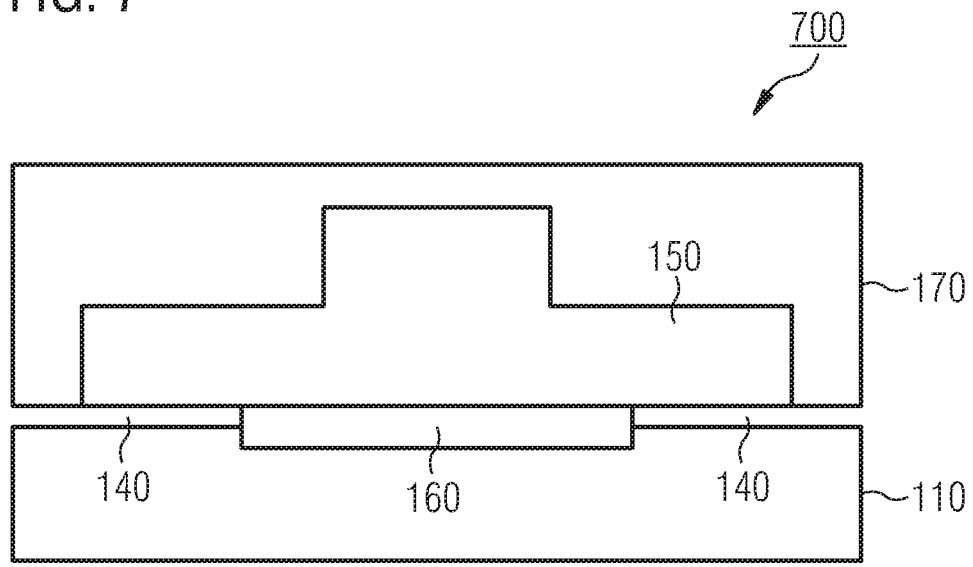
FIG. 7 shows a schematic cross section of a portion of a semiconductor device through an electrically conductive contact pad structure, a bond structure, and degradation prevention structure.

FIG. 7 shows a schematic cross section of a portion of a semiconductor device 700 through an electrically conductive contact pad structure 110, a bond structure 150, and a degradation prevention structure 140. The semiconductor device 700 may be similar to the semiconductor device 100 of FIG. 1. Additionally, the semiconductor device 700 comprises a semiconductor package structure 170 that is in contact with the bond structure 150 and with the degradation prevention structure 140. The semiconductor package structure 170 may comprise mold material. An enclosed interface region 160 laterally surrounded by the degradation prevention structure 140 is however not in contact with the semiconductor package structure 170. The enclosed interface region 160 may be vertically separated from the semiconductor package structure 170 by the bond structure 150 and may be laterally separated from the semiconductor package structure 170 by the degradation prevention structure 140. An enclosed intermetallic phase region may be located at the enclosed interface region 160.

The degradation prevention structure 140 of the semiconductor device 700 comprises an electrically conductive layer. The electrically conductive layer may comprise an electrically conductive material different from a material of the electrically conductive contact pad structure 110 (e.g., a first predominant electrically conductive material) and different from a material of the bond structure 150 (e.g., a second predominant electrically conductive material). A first portion of the electrically conductive layer is (directly) located vertically between the bond structure 150 and the electrically conductive contact pad structure 110. The first portion of the electrically conductive layer may laterally surround the enclosed interface region 160 and may be directly adjacent to the enclosed interface region 160. The first portion of the electrically conductive layer may laterally extend from the enclosed interface region 160 to the outer diameter of a portion of the bond structure 150 located at the front side surface of the electrically conductive contact pad structure 110. For example, a maximal width of the first portion of the electrically conductive layer (e.g., a lateral distance from the enclosed interface region 160 to the outer diameter of the portion of the bond structure 150 located at the front side surface of the electrically conductive contact pad structure 110) may be smaller than 20% (or smaller than 10%) and/or larger than 3% (or larger than 5%) than a diameter of the portion of the bond structure 150 located at the front side surface of the electrically conductive contact pad structure 110.

This may prevent the forming of intermetallic phase material outside the enclosed interface region and may prevent that any intermetallic phase material could be in contact with the mold material of the semiconductor package structure 170. In turn, this may prevent a degradation process (e.g., corrosion) from being initiated at the overall interface region between the bond structure 150 and the electrically conductive contact pad structure 110. Hence, a degradation of the contact between the bond structure 150 and the electrically conductive contact pad structure 110 may be prevented.

A second portion of the electrically conductive layer is (directly) located vertically between the semiconductor package structure 170 and the electrically conductive contact pad structure 110. The second portion of the electrically conductive layer may laterally surround the first portion of the electrically conductive layer and/or may be directly adjacent to the first portion of the electrically conductive layer. For example, the second portion of the electrically conductive layer may extend laterally from the first portion of the electrically conductive layer to at least an edge (or all edges) of the electrically conductive contact pad structure 110. In this way, the second portion of the electrically conductive layer may reduce and/or prevent contact between the mold material of the semiconductor package structure 170 and the electrically conductive contact pad structure 110 (e.g., a portion of the electrically conductive contact pad structure 110 that is not located vertically below the bond structure 150). This may prevent a degradation process (e.g., corrosion) from starting at the portion of the electrically conductive contact pad structure 110 that is not located vertically below the bond structure 150.

For example, FIG. 7 shows structured thin metal layers (e.g., an electrically conductive layer) protecting a central area of a bond. To achieve sealing effect (e.g., degradation prevention) thin structured layers of metals, which may be used as a diffusion stopper and/or an adhesion promoter, may be applied. This may be TiN, Ti/TiN, TaN, TiW, Ni/Pd etc. Compared to a usage of dielectrics (e.g., the semiconductor device 500 and semiconductor device 600) metals may be more ductile. For example, they may endure bonding with higher bonding forces and/or may be less susceptible towards destruction than dielectric structures during bonding. The usage of structured thin metal layers may prevent a presence of cracks and may thus prevent opening transport paths for aggressive elements and may prevent an at least partial loss of the sealing effect. Additionally, thin metal layers may also allow a design with a plurality of enclosed interface regions located vertically between the bond structure 150 and the electrically conductive contact pad structure 110. Alternatively, thin metals may be used as an unstructured passivation layer, covering the whole area of the pad (e.g., the whole front side surface of the electrically conductive contact pad structure 110).

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIGS. 1-6b) or below (e.g. FIGS. 8-11).

Figure 8:
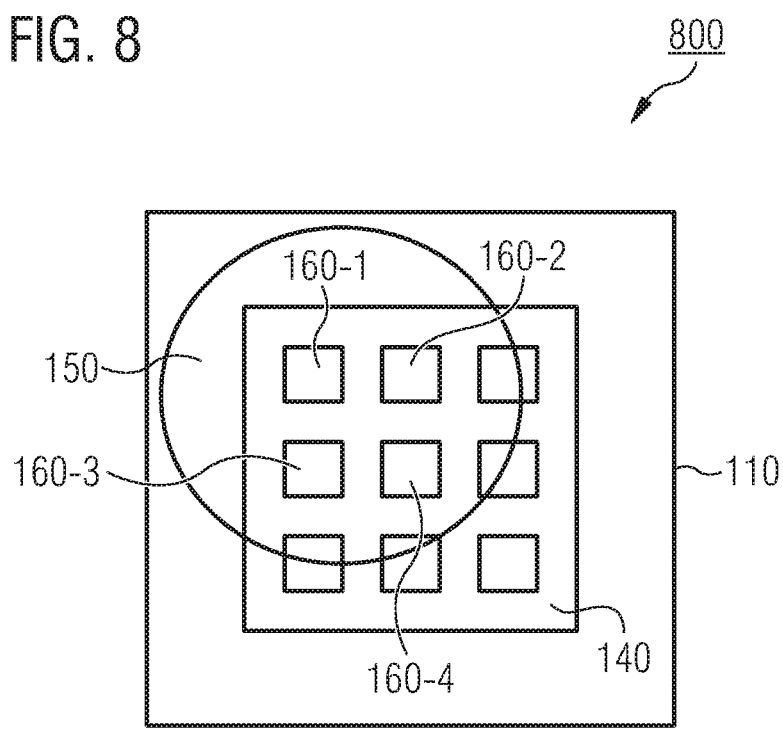
FIG. 8 shows a schematic top view of a portion of a semiconductor device comprising an electrically conductive contact pad structure, a bond structure, and a degradation prevention structure.

FIG. 8 shows a schematic top view of a portion of a semiconductor device 800 comprising an electrically conductive contact pad structure 110, a bond structure 150, and a degradation prevention structure 140 according to an embodiment. The semiconductor device 800 may be similar to the semiconductor device 100 of FIG. 1.

A plurality of enclosed interface regions is located between the electrically conductive contact pad structure 110 and the bond structure 150. Each enclosed interface region is laterally surrounded by the degradation prevention structure 140. In the example shown in FIG. 8 the plurality of enclosed interface regions comprises a total number of four enclosed interface regions (e.g., a first enclosed interface region 160-1, a second enclosed interface region 160-2, a third enclosed interface region 160-3, and a fourth enclosed interface region 160-4). Other front side surface sectors of the electrically conductive contact pad structure 110, which are each laterally surrounded by the degradation prevention structure 140, are only partially in contact with the bond structure 150 or exclude any contact with the bond structure 150. The division of the front side surface of the electrically conductive contact pad structure by the degradation prevention structure 140 into a plurality of front side surface sectors, of which some become enclosed interface regions after bonding the bond structure 150 to the electrically conductive contact pad structure 110, may allow larger manufacturing tolerances (e.g., larger tolerable lateral displacements) of the bond structure 150 from a prescribed position on the electrically conductive contact pad structure 110.

In the embodiment shown in FIG. 8, the degradation prevention structure 140 only extends partially over the front side surface of the electrically conductive contact pad structure 110. Only a central part of the front side surface of the electrically conductive contact pad structure 110 is divided into front side surface sectors that are each laterally surrounded by the degradation prevention structure 140. Optionally, the degradation prevention structure 140 may however extend over a larger part and/or over the entire front side surface of the electrically conductive contact pad structure 110, such that a larger part and/or the entire front side surface of the electrically conductive contact pad structure 110 may be divided into front side surface sectors that may become enclosed interface regions in the course of bonding. This may allow even larger manufacturing tolerances (e.g., larger tolerable lateral displacements) of the bond structure 150 from a prescribed position on the electrically conductive contact pad structure 110.

The degradation prevention structure 140 may comprise a trench extending into the electrically conductive contact pad structure 110. A cavity may be located in the trench and/or the trench may be filled with a solid dielectric material. Additionally or alternatively, the degradation prevention structure 140 may comprise a solid dielectric material structure formed on the front side surface of the electrically conductive contact pad structure 110. Alternatively, the degradation prevention structure 140 may comprise an electrically conductive layer (and/or a thin ceramic layer) that comprises an electrically conductive material (or a ceramic material, respectively) different from a material of the electrically conductive contact pad structure 110 and different from a material of the bond structure 150.

For example, FIG. 8 shows an embodiment (e.g., a design) with many bond spots. Introducing many spots on the pad (e.g., the electrically conductive contact pad structure 110) can make designs less sensitive to possible shifts of the bonding position. There may always be spots which are completely covered by the bond (e.g., the bond structure 150) and might not have direct contact to molding compound (e.g., to mold material of a semiconductor package structure).

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIGS. 1-7) or below (e.g. FIGS. 9-11).

Figure 9:
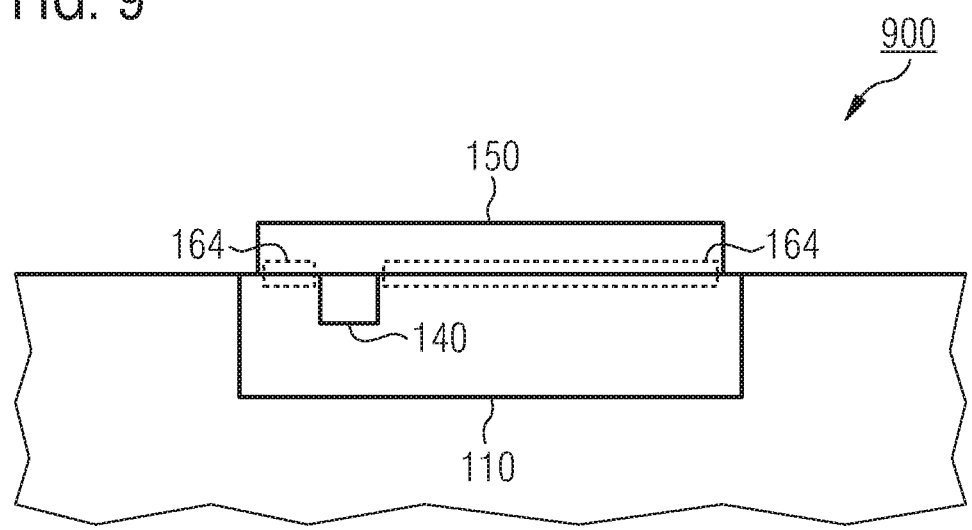
FIG. 9 shows a schematic cross section of a portion of another semiconductor device through an electrically conductive contact pad structure, a bond structure, and a degradation prevention structure.

FIG. 9 shows a schematic cross section of another semiconductor device 900 according to an embodiment. The semiconductor device 900 comprises an electrically conductive contact pad structure 110. The electrically conductive contact pad structure 110 comprises a first predominant electrically conductive material. Moreover, the semiconductor device 900 comprises a bond structure 150. The bond structure 150 comprises a second predominant electrically conductive material different from the first predominant electrically conductive material. At least one of the electrically conductive contact pad structure 110 and the bond structure 150 comprises an intermetallic phase region 164 at an interface region between the electrically conductive contact pad structure 110 and the bond structure 150. Additionally, the semiconductor device 900 comprises a degradation prevention structure 140 located laterally adjacent to the intermetallic phase region 164. The degradation prevention structure 140 is vertically located between a portion of the bond structure 150 and a portion of the electrically conductive contact pad structure 110.

Implementing a degradation prevention structure located laterally adjacent to an intermetallic phase region and located vertically between a portion of the bond structure and a portion of the electrically conductive contact pad structure, may reduce and/or slow down and/or avoid degradation of the electrical contact and/or the adhesion between the electrically conductive contact pad structure and the bond structure. This may result in a higher reliability and/or a longer lifetime of a semiconductor device comprising such a degradation prevention structure and/or may increase the yield during manufacturing of the semiconductor device.

The first predominant electrically conductive material may be a metal or a metal-alloy, for example. For example, the first predominant electrically conductive material may be aluminum, copper, gold, silver, tungsten, tin, polysilicon, or an alloy thereof.

The second predominant electrically conductive material may be a metal or a metal-alloy, for example. For example, the second predominant electrically conductive material may be aluminum, copper, gold, silver, tungsten, tin, or an alloy thereof and different from the first predominant electrically conductive material.

For example, if a degradation process (e.g., corrosion) starts at the interface region between the electrically conductive contact pad structure 110 and the bond structure 150 at one side (e.g., the left side) of the bond structure 150 in FIG. 9, the degradation process may only propagate to the degradation prevention structure 140 and may stop at the degradation prevention structure 140. At the opposite side of the degradation prevention structure 140 (e.g., at the right side), the interface region between the electrically conductive contact pad structure 110 and the bond structure 150 may be unaffected by the degradation process such that a sufficient electrical contact (and/or a sufficient adhesion) between the electrically conductive contact pad structure 110 and the bond structure 150 is still provided.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIGS. 1-8) or below (e.g. FIGS. 10-12).

Figure 10:
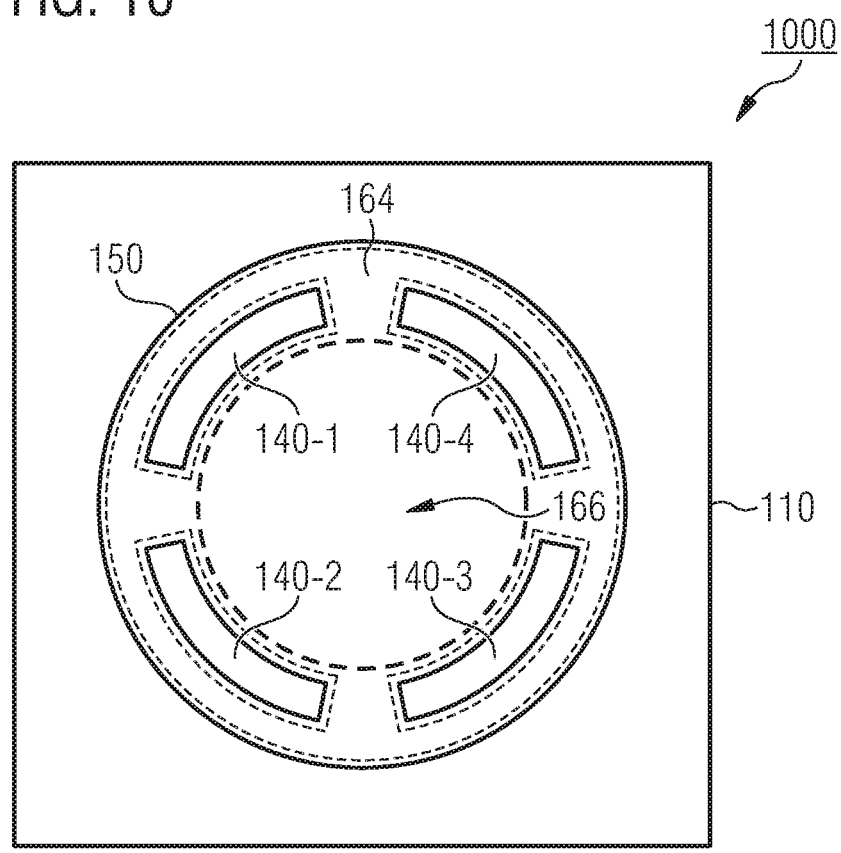
FIG. 10 shows a schematic top view of a portion of a semiconductor device comprising an electrically conductive contact pad structure, a bond structure, and a plurality of degradation prevention structures.

FIG. 10 shows a schematic top view of a portion of a semiconductor device 1000 comprising an electrically conductive contact pad structure 110, a bond structure 150, and a plurality of degradation prevention structures according to an embodiment. The semiconductor device 1000 may be similar to the semiconductor device 900 of FIG. 9.

In the example of the semiconductor device 1000 of FIG. 10, the plurality of degradation prevention structures comprises a total number of four degradation prevention structures (e.g., a first degradation prevention structure 140-1, a second degradation prevention structure 140-2, a third degradation prevention structure 140-3, and a fourth degradation prevention structure 140-4), but may optionally also comprise fewer or more degradation prevention structures. Each degradation prevention structure is vertically located between the electrically conductive contact pad structure 110 and the bond structure 150 and is laterally surrounded by the intermetallic phase region 164. The plurality of degradation prevention structures is arranged laterally around a central interface region 166 between the bond structure 150 and the electrically conductive contact pad structure 110 but does not enclose the central interface region, because adjacent degradation prevention structures of the plurality of degradation prevention structures (for instance, the first degradation prevention structure 140-1 and the second degradation prevention structure 140-2) are laterally separated by portions of the intermetallic phase region 164. The plurality of degradation prevention structures may reduce and/or avoid degradation of the electrical contact and/or of the adhesion between the electrically conductive contact pad structure 110 and the bond structure 150 at the central interface region 166. For example, the plurality of degradation prevention structures may reduce a transport of aggressive elements to the central interface region 166. Aggressive elements (e.g., sulphur, chlorine, or oxygen) may otherwise be a cause of corrosion, for example.

For example, a plurality of degradation prevention structures may be provided between a bond structure 150 and an electrically conductive contact pad structure 110 in semiconductor devices where a degradation prevention structure that laterally surrounds an enclosed interface region might not be implemented due to production-related reasons. For example, the plurality of degradation prevention structures and/or an open degradation prevention structure (e.g., the degradation prevention structure 140 of the semiconductor device 900 of FIG. 9) may at least extend along 10% of the perimeter of the central interface region 166 (or along at least 20%, or along at least 40%, or along at least 60%, or along at least 80% of the perimeter of the central interface region 166).

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIGS. 1-9) or below (e.g. FIGS. 11-12).

Figure 11:
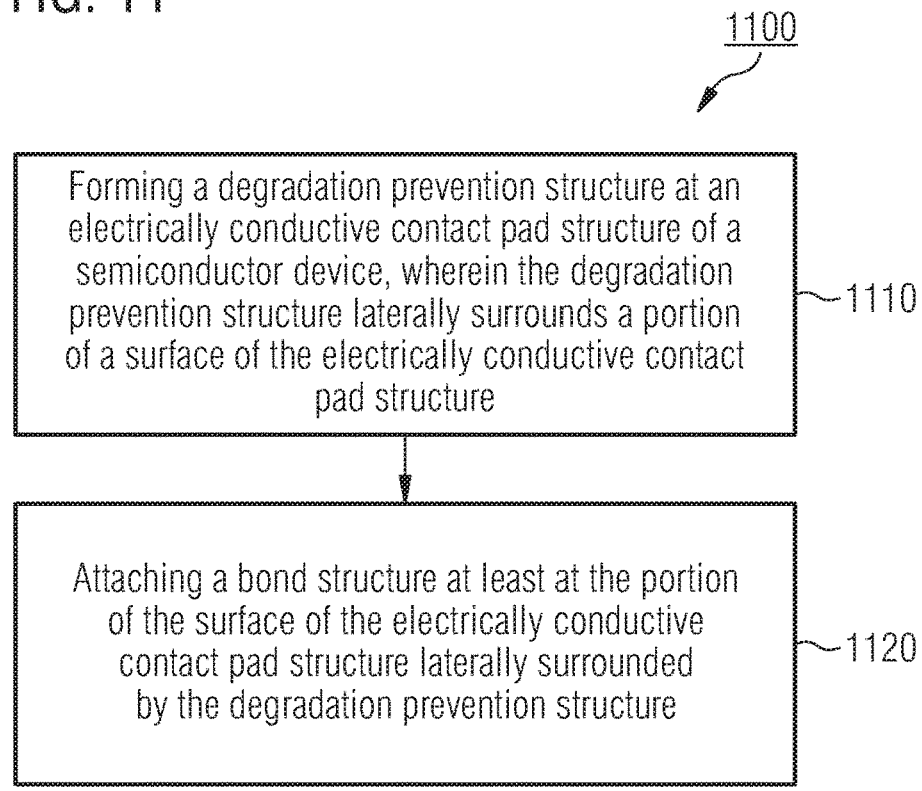
FIG. 11 shows a flow chart of a method for forming a semiconductor device.

FIG. 11 shows a flow chart of a method 1100 for forming a semiconductor device. The method 1100 comprises forming 1110 a degradation prevention structure at an electrically conductive contact pad structure of the semiconductor device. The degradation prevention structure laterally surrounds a portion of a surface of the electrically conductive contact pad structure. Furthermore, the method 1100 comprises attaching 1120 a bond structure at least at the portion of the surface of the electrically conductive contact pad structure laterally surrounded by the degradation prevention structure. After attaching 1120, the degradation prevention structure is vertically located between a portion of the bond structure and a portion of the electrically conductive contact pad structure.

By implementing a semiconductor device with a degradation prevention structure that laterally surrounds a portion of a surface of an electrically conductive contact pad structure, the reliability of the semiconductor device and/or the lifetime of the semiconductor device and/or the yield of the semiconductor device during manufacturing may be increased.

The portion of the surface (e.g., a front side surface) of the electrically conductive contact pad structure laterally surrounded by the degradation prevention structure may be a front side surface sector of the electrically conductive contact pad structure as explained in the context of the semiconductor device 100 of FIG. 1 and/or semiconductor device 600 of FIG. 6 and/or semiconductor device 800 of FIG. 8. Attaching 1120 the bond structure may comprise bonding and/or soldering the bond structure to the electrically conductive contact pad structure at the portion of the surface of the electrically conductive contact pad structure laterally surrounded by the degradation prevention structure. After attaching 1120 the bond structure, the bond structure may extend laterally across the entire portion of the surface of the electrically conductive contact pad structure laterally surrounded by the degradation prevention structure, so that the portion of the surface of the electrically conductive contact pad structure laterally surrounded by the degradation prevention structure may become an enclosed interface region as explained in context of the semiconductor device 100 of FIG. 1. After attaching 1120 the bond structure, the degradation prevention structure may be vertically located between a portion of the bond structure and a portion of the electrically conductive contact pad structure.

For example, the degradation prevention structure may comprise a trench extending into the electrically conductive contact pad structure. A cavity may be located in the trench. A volume of the cavity after attaching 1120 the bond structure may be larger than a volume of a portion of the electrically conductive contact pad structure displaced during attaching 1120 the bond structure.

For example, prior to attaching 1120 the bond structure, the volume of the cavity located in the trench may be at least twice as large as the volume of the portion of the electrically conductive contact pad structure displaced during attaching 1120 the bond structure. In this way, the cavity located in the trench may only be partially filled with material of the portion of the electrically conductive contact pad structure displaced during attaching 1120 the bond structure (e.g., during bonding and/or during soldering). The cavity may then prevent a direct contact between material of the electrically conductive contact pad structure (e.g., a first predominant electrically conductive material) and material of the bond structure (e.g., a second predominant electrically conductive material) at an interface region located between the degradation prevention structure and the bond structure. This may prevent forming of intermetallic phase material (based on at least the material of the electrically conductive contact pad structure and on the material of the bond structure) between the degradation prevention structure and the bond structure. In turn, paths for degradation processes (e.g., corrosion) leading to the enclosed interface region (that is laterally surrounded by the degradation prevention structure and vertically located between the electrically conductive contact pad structure and the bond structure) from a region located outside the degradation prevention structure and outside the enclosed interface region may be prevented, so that the enclosed interface region may be protected from degradation processes.

More details and aspects are mentioned in connection with the embodiments described above or below. The embodiment shown in FIG. 11 may comprise one or more optional additional features corresponding to one or more aspects mentioned in connection with the proposed concept or one or more embodiments described above (e.g. FIGS. 1-10) or below (e.g. FIG. 12).

Figure 12:
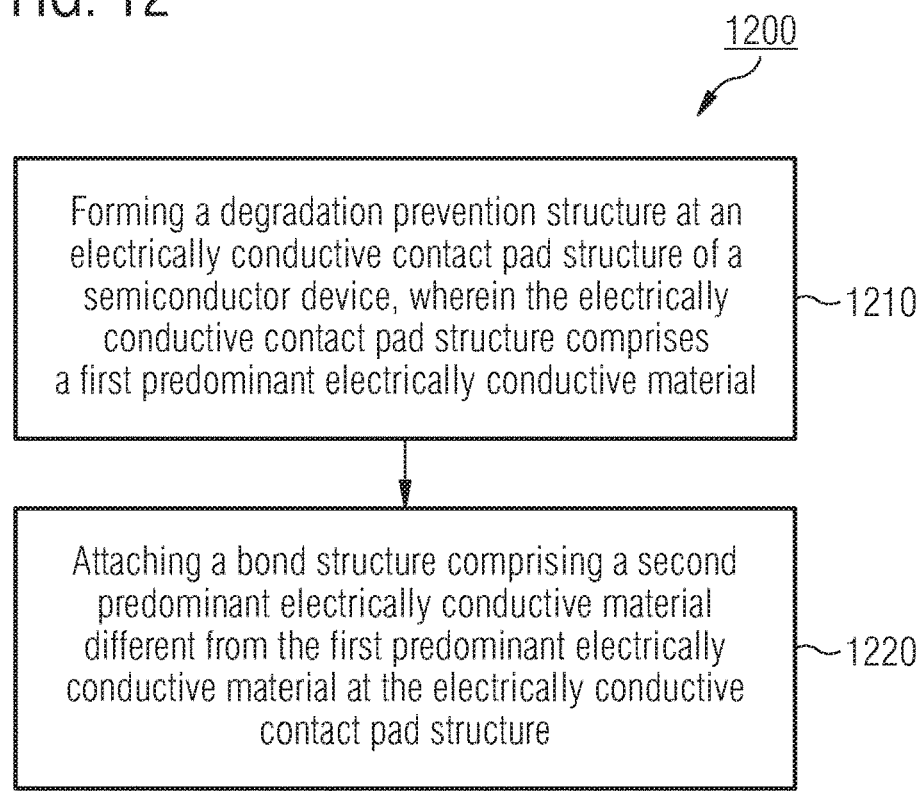
FIG. 12 shows a flow chart of another method for forming a semiconductor device.

FIG. 12 shows a flow chart of a method 1200 for forming a semiconductor device. The method 1200 comprises forming 1210 a degradation prevention structure at an electrically conductive contact pad structure of the semiconductor device. The electrically conductive contact pad structure comprises a first predominant electrically conductive material. Furthermore, the method 1200 comprises attaching 1220 a bond structure comprising a second predominant electrically conductive material different from the first predominant electrically conductive material at the electrically conductive contact pad structure. Attaching 1220 the bond structure comprises forming an intermetallic phase region at an interface region between the electrically conductive contact pad structure and the bond structure. The intermetallic phase region is located laterally adjacent to the degradation prevention structure. After attaching, the degradation prevention structure is vertically located between a portion of the bond structure and a portion of the electrically conductive contact pad structure.

By implementing a degradation prevention structure located vertically between an electrically conductive contact pad structure and a portion of a bond structure that comprise different predominant electrically conductive materials, forming of intermetallic phase material that might be susceptible towards degradation processes (e.g., towards corrosion) may be prevented at an interface region between the degradation prevention structure and the bond structure (and/or at an interface region between the degradation prevention structure and the electrically conductive contact pad structure). This may reduce the initiation and/or the propagation of degradation processes at the interface region between the electrically conductive contact pad structure and the bond structure (and/or at an interface region between the degradation prevention structure and the electrically conductive contact pad structure, respectively).

More details and aspects are mentioned in connection with the embodiments described above or below. The embodiment shown in FIG. 12 may comprise one or more optional additional features corresponding to one or more aspects mentioned in connection with the proposed concept or one or more embodiments described above (e.g. FIGS. 1-11) or below.

Some embodiments relate to cutting a transport path of aggressive elements to a center of a bond area. For example, without reactants a corrosion reaction (and/or other degradation processes) might not be possible. Embodiments are not restricted to aluminum-copper interfaces. A degradation prevention structure according to the present disclosure may work (e.g., provide a protection against degradation) for any interface that may comprise various materials, if degradation is due to diffusion of aggressive elements coming from outside of the bond area, for example.

For example, implementation of sealing structures (e.g., degradation prevention structures) on chip pads (e.g., electrically conductive contact pad structures) may provide a cost effective solution, which may increase lifetime of wire-pad connections and may keep bills of materials unchanged. This may reduce efforts for adaption of working plans, chip layouts and qualification programs of products (e.g., of semiconductor devices).

In other microelectronic devices, wire-pad connections may suffer from degradation, if subjected, for example, to high temperature. This effect may lead to complete loss of electrical contact and device failure. Understanding of degradation mechanisms may allow to propose measures (e.g., measures according to embodiments of the present disclosure), which can prevent it and increase lifetime of devices.

For example, a degradation mechanism may be a corrosion-like chemical reaction between some components of molding compound (e.g., sulphur, chlorine, and/or oxygen) and intermetallic phases (IMC). For instance, degradation processes (e.g., separation lines) may often start from outside, seldom from the middle of the wire-pad interface. Degradation may grow anisotropically, for example, along a copper-IMC interface.

Some devices may reduce and/or avoid degradation by using molding compounds without aggressive elements, for example, a sulphur-free molding compound. A degradation reaction may need both IMC and sulphur and may be prevented if one of these reactants is absent. Other degradation processes may be initiated independently of the presence and/or absence of IMC and/or sulphur.

Changing of materials in a package may be however a risky and an expensive solution. For example, high development costs may arise as a new molding compound may need to pass qualifications. New materials may lead to new problems. For example, sulphur may be used as an adhesion promoter. Without it packages may suffer from delamination risks.

An approach according to the present disclosure may have an objective to prevent degradation keeping bills of materials in a package and/or in a device. This may provide a cost effective solution, because minimal changes in working plans and/or qualification programs may be necessary. For example, sealing structures (e.g., degradation prevention structures) can be introduced in pads, which may stop diffusion of aggressive elements from molding compounds to the middle of a bonded wire. For example, without reactants no corrosion reaction may be possible. Various embodiments (e.g., designs) may be possible and may protect a central area (e.g., an enclosed interface region and/or a central interface region) from diffusion of aggressive elements. Embodiments may differ in concrete realization, reflecting possible difficulties in practical realization, for example.

Other devices may comprise molding compound without sulphur, which may reduce corrosion. However, sulphur might not be the only source for corrosion and/or degradation. Without sulphur semiconductor package structures may comprise low adhesion. In other devices aluminum in pads may be replaced with copper, which may reduce and/or avoid forming of aluminum-copper intermetallic phases, which may be sensitive to sulphur. However, the adhesion at, for example, a copper-copper interface may be lower and might not pass qualifications. In other devices, the whole area of the pad may be covered with stable metal (e.g., titanium-tungsten, TiW), which may reduce and/or avoid forming of aluminum-copper intermetallic phases. However, copper/TiW and/or aluminum/TiW interfaces might not be stable against sulphur, chlorine, and/or oxygen and may degrade.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
   an electrically conductive contact pad structure;
   a bond structure over the electrically conductive contact pad structure and in contact with the electrically conductive contact pad structure at an enclosed interface region; and
   a degradation prevention structure laterally surrounding the enclosed interface region, wherein the degradation prevention structure is vertically located between a portion of the bond structure and a portion of the electrically conductive contact pad structure,
   wherein the bond structure comprises a bond wire, a solder ball or a solder pillar disposed over the contact pad structure, wherein the semiconductor device comprises a planar upper surface, wherein the contact pad structure and the degradation prevention structure are disposed at and below the planar upper surface of the semiconductor device, and wherein the bond structure is disposed at and above the planar upper surface of the semiconductor device.

2. The semiconductor device according to claim 1, wherein the electrically conductive contact pad structure comprises a first predominant electrically conductive material, wherein the bond structure comprises a second predominant electrically conductive material different from the first predominant electrically conductive material, wherein at least one of the electrically conductive contact pad structure and the bond structure comprises an intermetallic phase region at the enclosed interface region.

3. The semiconductor device according to claim 1, wherein a minimal width of the degradation prevention structure is larger than 1 µm.

4. The semiconductor device according to claim 1, wherein the bond structure is in contact with the electrically conductive contact pad structure additionally at a peripheral interface region.

5. The semiconductor device according to claim 4, wherein the peripheral interface region laterally surrounds the degradation prevention structure.

6. The semiconductor device according to claim 1, wherein a maximal lateral extension of the enclosed interface region is smaller than 90% of a maximal lateral extension of an overall interface region between the electrically conductive contact pad structure and the bond structure.

7. The semiconductor device according to claim 1, wherein a plurality of enclosed interface regions is located between the electrically conductive contact pad structure and the bond structure, wherein each enclosed interface region is laterally surrounded by the degradation prevention structure.

8. The semiconductor device according to claim 1, wherein a total lateral area of the enclosed interface region or of all enclosed interface regions is larger than 60% of a lateral area of an overall interface region between the electrically conductive contact pad structure and the bond structure.

9. The semiconductor device according to claim 1, wherein a minimal vertical distance between the degradation prevention structure and a backside surface of the electrically conductive contact pad structure is larger than 100 nm.

10. The semiconductor device according to claim 1, further comprising a semiconductor package structure, wherein the semiconductor package structure comprises mold material, wherein the enclosed interface region is separated from the mold material by the degradation prevention structure.

11. The semiconductor device according to claim 10, wherein the mold material of the semiconductor package structure is in contact with a portion of the electrically conductive contact pad structure outside the enclosed interface region and is in contact with the bond structure.

12. The semiconductor device according to claim 1, wherein the degradation prevention structure comprises a solid dielectric material structure formed on a surface of the electrically conductive contact pad structure.

13. The semiconductor device according to claim 1, wherein the degradation prevention structure comprises a trench extending into the electrically conductive contact pad structure.

14. The semiconductor device according to claim 13, wherein the trench is filled with a solid dielectric material, or wherein a cavity is located in the trench.

15. The semiconductor device according to claim 1, wherein a vertical extension of the degradation prevention structure is larger than 500 nm.

16. The semiconductor device according to claim 1, wherein the degradation prevention structure comprises an electrically conductive layer, wherein the electrically conductive layer comprises an electrically conductive material different from a material of the electrically conductive contact pad structure and different from a material of the bond structure.

17. The semiconductor device according to claim 16, wherein a thickness of the electrically conductive layer is smaller than 1 µm.

18. The semiconductor device according to claim 16, wherein the electrically conductive layer extends laterally from the enclosed interface region to an edge of the electrically conductive contact pad structure.

19. A semiconductor device comprising:
an electrically conductive contact pad structure comprising a first predominant electrically conductive material;
a bond structure comprising a second predominant electrically conductive material different from the first predominant electrically conductive material, wherein at least one of the electrically conductive contact pad structure and the bond structure comprises an intermetallic phase region at an interface region between the electrically conductive contact pad structure and the bond structure; and
a degradation prevention structure located laterally adjacent to the intermetallic phase region, wherein the degradation prevention structure is vertically located between a portion of the bond structure and a portion of the electrically conductive contact pad structure,
wherein the bond structure is over the electrically conductive contact pad structure and comprises a bond wire, a solder ball or a solder pillar disposed over the contact pad structure, wherein the semiconductor device comprises a planar upper surface, wherein the contact pad structure and the degradation prevention structure are disposed at and below the planar upper surface of the semiconductor device, and wherein the bond structure is disposed at and above the planar upper surface of the semiconductor device.

20. A semiconductor device comprising:
a contact pad structure having an upper surface;
a bond structure having a lower surface;
a deposited material structure between the upper surface of the contact pad structure and the lower surface of the bond structure; and
a plurality of degradation prevention structures extending vertically through the deposited material structure;
wherein at least one of the plurality of degradation prevention structures comprises a cavity.

21. The semiconductor device according to claim 20, wherein the deposited material structure comprises a metal.

22. The semiconductor device according to claim 20, further comprising a molding material surrounding at least a portion of the bond structure, at least a portion of the deposited material structure, and at least a portion of the contact pad structure.

23. A semiconductor device comprising:
a contact pad structure having an upper surface;
a bond structure having a lower surface;
an interface region between the upper surface of the contact pad structure and the lower surface of the bond structure located in a central portion of the semiconductor device;
a plurality of degradation prevention structures between the upper surface of the contact pad structure and the lower surface of the bond structure located in peripheral portions of the semiconductor device; and
at least one tapered cavity located between at least one of the degradation prevention structures and the interface region.

24. The semiconductor device of claim 23, wherein at least one of the degradation prevention structures comprises a dielectric material.

25. The semiconductor device of claim 23, wherein the interface region comprises an enclosed intermetallic phase region.

26. The semiconductor device of claim 23, further comprising a molding compound surrounding at least a portion of the contact pad structure and at least a portion of the bond structure.

* * * * *